(12) United States Patent
Han

(10) Patent No.: US 11,495,675 B2
(45) Date of Patent: Nov. 8, 2022

(54) MANUFACTURE METHOD OF LATERAL DOUBLE-DIFFUSED TRANSISTOR

(71) Applicant: Joulwatt Technology Co., Ltd., Hangzhou (CN)

(72) Inventor: Guangtao Han, Hangzhou (CN)

(73) Assignee: JOULWATT TECHNOLOGY CO., LTD., Hangzhou (CN)

( * ) Notice: Subject to any disclaimer, the term of this patent is extended or adjusted under 35 U.S.C. 154(b) by 9 days.

(21) Appl. No.: 17/376,111

(22) Filed: Jul. 14, 2021

(65) Prior Publication Data

US 2022/0020863 A1      Jan. 20, 2022

(30) Foreign Application Priority Data

Jul. 14, 2020   (CN) .......................... 202010674577.6
Aug. 25, 2020  (CN) .......................... 202010864193.0

(51) Int. Cl.
  *H01L 29/66*   (2006.01)
  *H01L 29/78*   (2006.01)
  *H01L 21/04*   (2006.01)

(52) U.S. Cl.
  CPC .... *H01L 29/66681* (2013.01); *H01L 21/0415* (2013.01); *H01L 29/7816* (2013.01)

(58) Field of Classification Search
  CPC ........... H01L 29/66681; H01L 21/0415; H01L 29/7816; H01L 21/26586; H01L 29/665; H01L 29/6653; H01L 29/66689
  See application file for complete search history.

(56) References Cited

U.S. PATENT DOCUMENTS

2015/0287820 A1*  10/2015  Mallikarjunaswamy ................... H01L 29/0634
                                                                      257/341
2018/0090613 A1*  3/2018   McGregor ......... H01L 29/4916

FOREIGN PATENT DOCUMENTS

CN           111048420 A       4/2020

* cited by examiner

*Primary Examiner* — Mohammed R Alam
(74) *Attorney, Agent, or Firm* — Treasure IP Group, LLC

(57) ABSTRACT

The present disclosure provides a manufacture method of an LDMOS. The manufacture method includes: forming a drift region in a substrate; forming a gate structure on the substrate, the gate structure defining a source region and a drain region which are separated from each other, and the gate structure including a gate oxide layer and a gate conductor layer which are successively stacked on the substrate; forming a first doped region in the source region, wherein the first doped region is surrounded by the drift region; forming a first barrier layer with a first opening on the source region and in connect with sidewall of the gate structure; forming a first implantation region in the source region through self-aligned implantation on the basis of the first opening of the first barrier layer; and forming a second implantation region and a third implantation region respectively.

15 Claims, 18 Drawing Sheets

-prior art-

MANUFACTURE METHOD OF LATERAL DOUBLE-DIFFUSED TRANSISTOR

CROSS-REFERENCE TO RELATED APPLICATION

This application claims priority to the Chinese Patent Application No. 2020106745776, filed on Jul. 14, 2020 and entitled "MANUFACTURE METHOD OF LATERAL DOUBLE-DIFFUSED TRANSISTOR", and the Chinese Patent Application No. 2020108641930, filed on Aug. 25, 2020 and entitled "MANUFACTURE METHOD OF LATERAL DOUBLE-DIFFUSED TRANSISTOR", which are incorporated herein by reference in its entirety in this disclosure.

BACKGROUND OF THE DISCLOSURE

Field of Technology

The present disclosure relates to the technical field of semiconductors, in particular to a manufacture method of a lateral double-diffused transistor.

Description of the Related Art

A lateral double-diffused metal-oxide-semiconductor field effect transistor (LDMOS), as a kind of power field effect transistor, has outstanding performances such as process compatibility, desirable thermal stability and frequency stability, high gains, low feedback capacitance and thermal resistances, and constant input impedance, and has been widely used accordingly. The requirements for the performance of the LDMOS become increasingly high.

The LDMOS device is a key component of a whole power integrated circuit, and its structure and performance directly affect the performance of the power integrated circuit. The performance of the LDMOS is measured based on the main parameters of on-state resistances and breakdown voltages. The smaller the on-state resistance is, the higher the performance is. The higher the breakdown voltage is, the higher the performance is. In fact, the on-state resistance and the breakdown voltage are two contradictory parameters. In practical applications of the LDMOS, it is required to reduce a source-drain on-state resistance Rdson of the device as much as possible on the premise that a source-drain breakdown voltage off-BV is high enough, however, the optimization requirements of both source-drain breakdown voltage and on-state resistance are indeed contradictory. Normally, the on-state resistance of the LDMOS is reduced by continuously increasing the concentrations of drift region, and at the meantime completely depleting the drift region based on various theories of reducing surface electric field (RESURF), so as to obtain a low on-state resistance and maintain a high off-state breakdown voltage. In addition, a size of the device may also affect the on-state resistance of the device. Due to the influence of the manufacture method, the LDMOS in the prior art has a large size and high resistance.

FIG. 1 shows a sectional structural schematic diagram at a source region of a traditional LDMOS. As shown in FIG. 1, this LDMOS includes: a substrate 101, a first doped region 103 (a body region or a channel region), a drift region 102, a source region, a drain region (not shown), a gate structure, a side wall 121, a dielectric layer 151 (e.g., a metal silicide layer) and a dielectric layer 161, wherein the first doped region 103 and the drift region 102 are formed in the substrate 101, and the first doped region 103 and the drift region 102 have different doping concentrations. The source region is in connection with the first doped region 103, the drain region is in connection with the drift region 102, the gate structure includes a gate conductor layer 112 (e.g., a polysilicon gate) and a gate oxide layer 111 located between the polysilicon gate 112 and the substrate 101. The source region has a first N+ implantation region, a P+ implantation region (e.g., as a body contact region) and a second N+ implantation region, which are independent from one another and exclusive of one another.

A manufacture method of the LDMOS includes: forming a drift region 102 at a top of the substrate 101, forming a gate oxide layer 111 and a gate conductor layer 112 on a surface of the drift region 102 and forming an opening by etching, implanting ions to form a first doped region 103 through the opening; forming side walls 121 on sidewalls of the gate structure at both sides of the opening through media deposition or etching process; forming an first N+ implantation region in the first doped region 103 by using photoresist as a mask; forming a P+ implantation region in the first doped region 103 by use of a new photoresist as a mask after remove the previous photoresist; covering a surface of the gate conductor layer 112 and a surface of the source region by use of a dielectric layer 151; forming a dielectric layer 161 on a surface of the dielectric layer 151; and etching at the position of the dielectric layer 161 corresponding to the source region to form a through hole arriving a surface of the dielectric layer 151, wherein the through hole is used to lead out a source electrode.

The first N+ implantation region, the P+ implantation region and the second N+ implantation region located in the source region are all formed by photolithography implantation. Due to a limit of the photolithography capacity, sizes of the first N+ implantation region, the P+ implantation region and the second N+ implantation region may not be small. Taking an N-type lateral double-diffused MOS(NLDMOS) formed in a 180 nm process as an example, a first N+ implantation region, a P+ implantation region and a second N+ implantation region of its source region generally have a width of about 0.4 μm. With reference to a structure shown in FIG. 1, a width of a dielectric layer 151 located above the source region and between the side walls 121 has a width of about 1.2 μm. On the basis of this structure, a source-drain on-state resistance of the LDMOS device may be very high, thereby reducing the performance of the LDMOS device and affects the application prospects of LDMOS device. Moreover, the steps of forming a structure in this process are relatively complicated, and photoresist layers are used many times, which is not easy to operate.

Therefore, it is necessary to provide an improved technical solution to overcome the above technical problems existing in the prior art.

SUMMARY

In order to solve the above technical problem, the present disclosure provides a manufacture method of an LDMOS, through which a size of several implantation regions in a source region may be reduced, and a space between gate conductor layers above the source region as well as the size of the device may be reduced, to provide a more concise manufacturing process, saving materials, effectively reducing a source-drain on-state resistance for realizing.

The manufacture method of an LDMOS provided according to the present disclosure comprises: forming a drift region with a second doping type in a substrate with a first doping type; forming a gate structure on the substrate, wherein the gate structure defines a source region and a drain region which are separated from each other in the drift region, and the gate structure comprises a gate oxide layer and a gate conductor layer which are successively stacked on the substrate; forming a first doped region with the first doping type in the source region, wherein the first doped region is surrounded by the drift region; forming a first barrier layer with a first opening on the source region, the first barrier layer is in connect with a sidewall of the gate structure; forming a first implantation region in the source region through self-aligned implantation on the basis of the first opening of the first barrier layer; and forming a second implantation region and a third implantation region in the source region, the second implantation region and the third implantation region are respectively adjacent to the first implantation region on both sides of the first implantation region.

In some embodiments, a step of forming the second implantation region and the third implantation region comprises: forming a second barrier in the first opening of the first barrier layer, wherein the first opening penetrates the first barrier layer; removing the first barrier layer by etching; and forming a second implantation region and a third implantation region in the drift region through self-aligned implantation on the basis of the second barrier and the sidewall of the gate structure.

In some embodiments, both sides of the first barrier layer are in contact with two opposite sidewalls of the gate structure respectively.

In some embodiments, a step of forming a first barrier layer with a first opening on the source region comprises: controlling a width of the first barrier layer by adjusting isotropic etching rates and anisotropic etching rates.

In some embodiments, the first implantation region has the first doping type, the second implantation region and the third implantation region have the second doping type.

In some embodiments, further comprises: removing the second barrier; and forming at least one side wall on the sidewalls of the gate structure.

In some embodiments, after forming the side wall, the manufacture method further comprises: forming a dielectric layer on the substrate, wherein the dielectric layer covers a part of the source region exposed by the side wall and an upper surface of the gate structure.

In some embodiments, after forming the dielectric layer on the substrate, the manufacture method further comprises: forming a passivation layer on an upper surface of the dielectric layer, wherein the passivation layer has a through hole above the source region, and the through hole corresponds to a position of the first implantation region and arrives the upper surface of the dielectric layer; and forming metal contact in the through hole to lead out a source electrode.

In some embodiments, the first doping type is P type, and the second doping type is N type; alternatively, the first doping type is N type, and the second doping type is P type.

In some embodiments, a step of forming a gate structure and forming the first doped region comprises: forming the gate oxide layer and the gate conductor layer which are successively stacked on the drift region; etching the gate conductor layer and the gate oxide layer through a patterned photoresist layer, to form a second opening exposing the source region; and implanting ions in the drift region through the second opening to form the first doped region.

In some embodiments, a step of forming the second implantation region and the third implantation region comprises: implanting ions obliquely at the first doped region through the second opening by use of the photoresist layer respectively, to form the second implantation region and the third implantation region, wherein a width of the second implantation region and the third implantation region are at least defined by a thickness of the photoresist layer.

In some embodiments, a step of forming the first implantation region comprises: after forming the second implantation region and the third implantation region, forming the first barrier layer with a first opening, and forming the first implantation region by implanting ions between the second implantation region and the third implantation region through the first opening of the first barrier layer.

In some embodiments, a position of the first opening of the first barrier layer corresponds to a groove opening of the first implantation region, and not penetrates the first barrier layer.

In some embodiments, after forming the first implantation region, the second implantation region and the third implantation region, the manufacture method further comprises: by adjusting isotropic etching rates and anisotropic etching rates, etching a part of the first barrier layer, so that the first barrier layer exposes the first implantation region, a portion of the second implantation region, and a portion of the third implantation region, and remaining first barrier layer serves as at least one side wall of the gate structure.

The present disclosure has the following beneficial effects: the present disclosure provides a manufacture method of the LDMOS, the method includes: forming a drift region in a substrate; forming a gate structure on the substrate, the gate structure defining a source region and a drain region which are separated from each other, and the gate structure including a gate oxide layer and a gate conductor layer which are successively stacked on the substrate; forming a first doped region in the source region, wherein the first doped region is surrounded by the drift region; forming a first barrier layer with a first opening on the source region and in connect with sidewall of the gate structure; forming a first implantation region in the source region through self-aligned implantation on the basis of the first opening of the first barrier layer; and forming a second implantation region and a third implantation region respectively, which are adjacent to the first implantation region on both sides of the first implantation region and have an opposite doping type to the first implantation region. Therefore, the source region is no more limited by the photolithography process capacity, the formed implantation region is smaller accordingly, which effectively reduce the first opening of the gate conductor layer above the source region, and thusly it is beneficial to reduce the size of the device and reduce the source-drain on-state resistance. It can also save process steps, make the formation of the implantation regions in the source region relatively simple, reduce the process difficulty, and simplify the process flow.

In some alternative embodiments, the source region (includes the second implantation region, the first implantation region and the third implantation region) with the implantation regions having different doping types and different doping concentrations is formed through self-aligned implantation of doped ions by use of side walls formed multiple times through the process and combining the gap of the polysilicon layer above the source region, so that the source region is not limited by the photolithography process capacity, the formed implantation region is smaller when compared with traditional manufacture method.

In some alternative embodiments, the gate conductor layer and the gate oxide layer may be etched in the source region by use of a patterned photoresist layer, and the first doped region (for example serving as a body region) is formed by ion implantation; by use of the photoresist layer, forming the second implantation region and the third implantation region in the drift region by implanting ions obliquely, so that width of the second implantation region and of the third implantation region may be controlled by implanting angle and a width of the photoresist layer, the size of the implantation region and the device can be reduced, the source-drain on-state resistance can be effectively reduced, and the process can be greatly simplified. The steps make the formation of the second implantation region and the third implantation region relatively simple and reduce the process difficulty, so as to reduce the on-state resistance of the device while simplifying the supply process.

In some alternative embodiments, a first barrier layer may cover the first doped region and the gate conductive layer, and has a groove opening above the first doped region, so that semiconductor structure under the first barrier layer is protected. Later, the first barrier layer may be directly etched to form side walls, which saves materials, avoids waste of barrier materials, simplifies process steps, saves costs, and reduces operation difficulty.

BRIEF DESCRIPTION OF THE DRAWINGS

The above and other objectives, features and advantages of the present disclosure will become more apparent from the description of embodiments of the present disclosure below with reference to the accompanying drawings.

DETAILED DESCRIPTION OF THE DISCLOSURE

Figure 1:
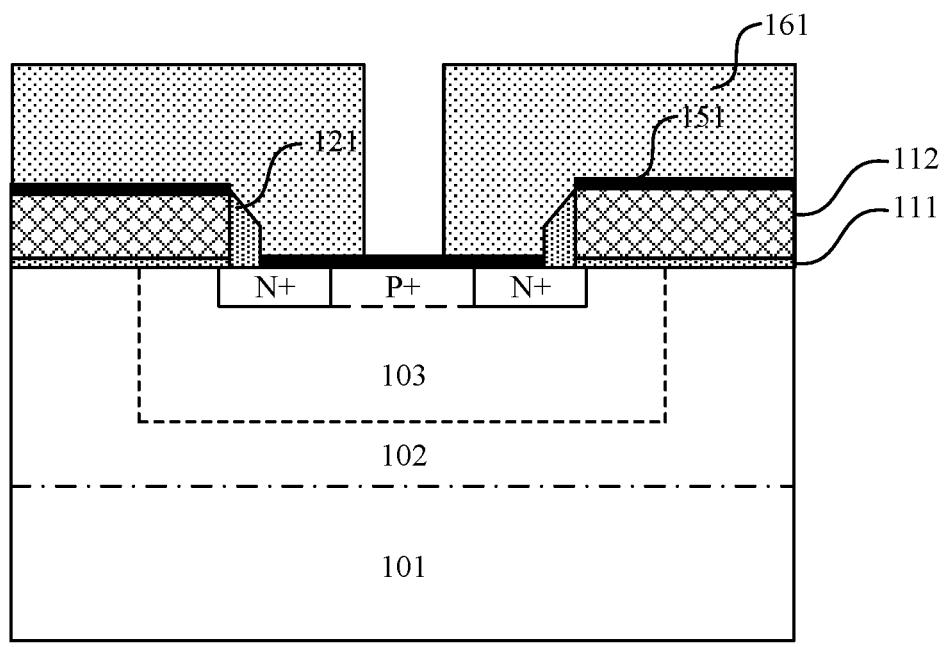
FIG. 1 shows a sectional structural schematic diagram at a source region of a traditional LDMOS.

Various embodiments of the present disclosure will be described in more detail below with reference to the accompanying drawings. In the various accompanying drawings, the same elements are denoted by the same or similar reference numerals. For the sake of clarity, the various portions in the accompanying drawings are not drawn to scale. In addition, some well-known portions may not be shown. For simplicity, a semiconductor structure obtained after several steps may be described in one figure.

During description of the structure of a device, when a layer or a region is called "on" or "above" another layer or another region, it may be directly on another layer or another region, or other layers or regions are included between it and another layer or another region. In addition, if the device is turned over, the layer and the region will be located "under" or "below" another layer and another region.

In order to describe the situation of being directly on another layer and another region, the specification uses the expression of "A is directly on B" or "A is on B and adjacent to B". In the present application, "A is directly located in B" means that A is located in B, and A is directly adjacent to B, rather than that A is located in a doped region formed in B.

Unless specifically indicated hereinafter, various layers or regions of the semiconductor device may be composed of materials known to those skilled in the art. Semiconductor materials include, for example, group III-V semiconductors such as gallium arsenide (GaAs), indium phosphide (InP), gallium nitride (GaN) and silicon carbide (SiC), and group IV semiconductors such as silicon (Si) and germanium (Ge). A gate conductor and electrode layer may be made from various conductive materials, such as metal layers, doped gate conductor layers, or stacked gate conductors including the metal layer and the doped gate conductor layer, or other conductive materials, such as tantalum carbide (TaC), titanium nitride (TiN), TaSiN, HfSiN, titanium nitride silicon (TiSiN), titanium carbonitride (TiCN), TaAlC, titanium aluminium nitride (TiAlN), tantalum mononitride (TaN), PtSix, Ni3Si, platinum (Pt), ruthenium (Ru), wolfram (W), and the various conductive materials.

In the present application, the term "semiconductor structure" refers to the general name of the whole semiconductor structure formed in each step of manufacturing a semiconductor device, including all layers or regions that have been formed. The term "laterally extending" means extending in a direction substantially perpendicular to a depth direction of a trench.

The specific implementation of the present disclosure will be further described in detail with reference to accompanying drawings and in conjunction with the embodiments.

Figure 2:
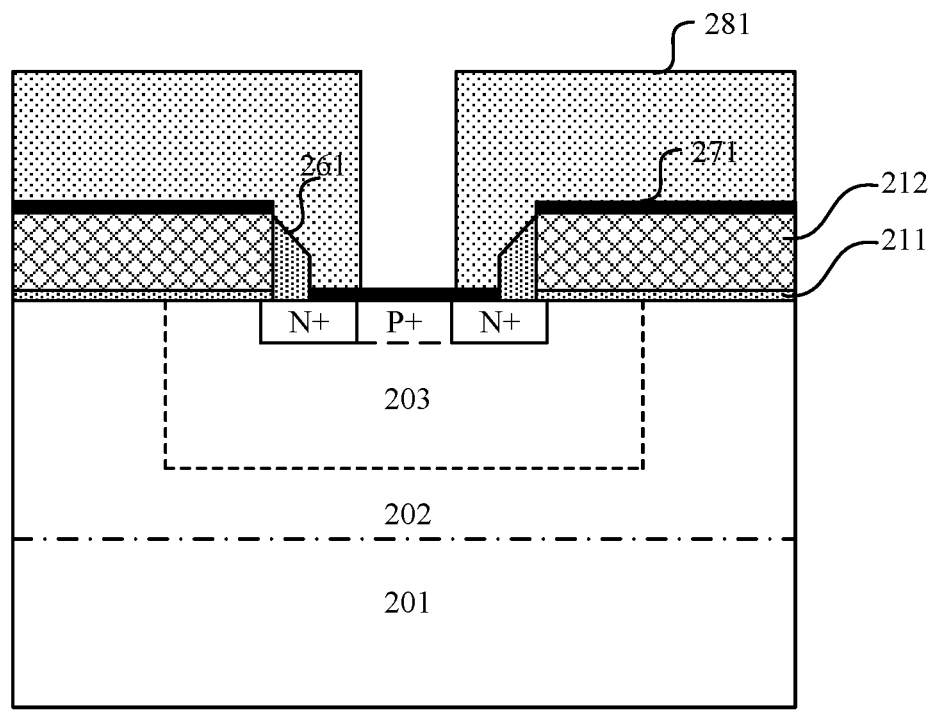
FIG. 2 shows a sectional structural schematic diagram at a source region of an LDMOS provided by an embodiment of the present disclosure.

FIG. 2 shows a sectional structural schematic diagram at a source region of an LDMOS provided by an embodiment of the present disclosure.

With reference to FIG. 2, an embodiment of the present disclosure provides an lateral double-diffused metal-oxide-semiconductor MOS (LDMOS). The LDMOS includes a substrate 201 with a first doping type, a drift region 202 with a second doping type located in the substrate 201, and a first doped region 203 (serve as a channel region or a body region) with a first doping type, wherein the drift region 202 is located in the substrate 201 and surrounds the first doped region 203. The first doped region 203 and the drift region 202 are formed in the substrate 201 and used for transporting electrons to achieve electrical conduction, and the first doped region 203 and the drift region 203 have different doping concentrations, so as to achieve different conduction performances. The LDMOS further includes a source region, a drain region (not shown), a gate structure, at least one side wall 261, a dielectric layer 271 and a passivation layer 281 located on the substrate 201.

The source region and the first doped region 203 are in connection with each other, the drain region and the drift region 202 are in connection with each other, so that an electrical connection to input of an external voltage may be achieved. The gate structure includes a gate conductor layer 212 (e.g., polysilicon layer) and a gate oxide layer 211, which is located between the gate conductor layer 212 and the substrate 201. At least one side wall 261 is formed at a side surface of the gate structure. A portion of the dielectric layer 271 covers an upper surface of the source region, and the other portion of the dielectric layer 271 covers an upper surface of the gate structure. At least one N+ implantation region and at least one P+ implantation region, which are independent and exclusive from one another, are formed at the source region. In this embodiment, the source region includes a first N+ implantation region (a second implantation region), a first P+ implantation region (a first implantation region) and a second N+ implantation region (a third implantation region), wherein the three implantation regions may be formed with same or similar widths by use of a photolithography process.

The passivation layer 281 is located on a surface of the dielectric layer 271, and is provided with a through hole arriving the surface of the dielectric layer 271 in a center of an upper portion of the source region. The through hole has a position corresponding to a position of the first P+ implantation region, and is used for leading out a source electrode.

In an LDMOS device formed through a manufacture method thereof provided according to an embodiment of the present disclosure, the first N+ implantation region, the P+ implantation region and the second N+ implantation region are independent from each other and do not contain each other in the source region. Compared with prior art, the embodiment of the present disclosure is not limited by the capacity of the photolithography process, the formed three implantation regions have smaller widths, a space of the gate conductor layers in the gate structure above the source region is arranged to be smaller, and a lower source-drain on-state resistance may be obtained.

FIGS. 3a-3g show sectional schematic diagrams of formed structures of a source region at various stages in the manufacture method of the LDMOS shown in FIG. 1 respectively. The following takes an N-type LDMOS as an example and combines FIGS. 3a-3g to describe a manufacture process and the disadvantages of the source region in a traditional LDMOS shown in FIG. 1.

Figure 3A:
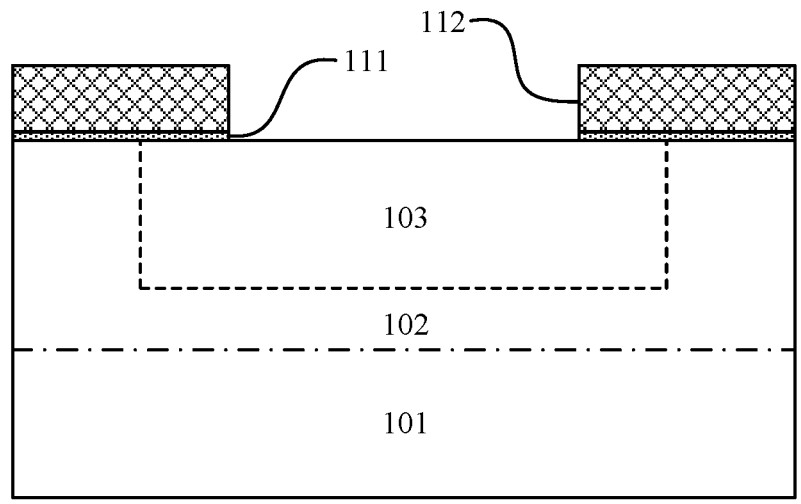
FIGS. 3a-3g show sectional schematic diagrams of formed structures of a source region at various stages in the manufacture method of the LDMOS according to FIG. 1 respectively.

Firstly, as shown in FIG. 3a, ion doping and diffusion are performed in an N-type doped semiconductor substrate 101, such as a silicon substrate, to form a drift region 102 with a certain ion concentration. Using a mask is a necessary step in a preparation process when forming the drift region 102 and a first doped region 103 and will not be described in detail herein. Then, at least a gate oxide layer 111 and a gate conductor layer 112 are sequentially deposited on a surface of the semiconductor substrate 101 to form a mask layer, and then the gate conductor layer 112 and the gate oxide layer 111 are etched by use of an photoresist layer 113 coated onto the gate conductor layer 112 as a barrier, so as to define a source region and a drain region (not shown). Through ion doping and diffusion, a first doped region 103 having a certain ion concentration is formed. Then the photoresist layer 113 is removed to form a gate structure. In the sequentially stacked gate structure, the gate oxide layer 111 is, for example, a silicon oxide layer, and the gate conductor layer 112 is, for example, a polysilicon layer. The gate oxide layer 111 and the gate conductor layer 112 are formed through a conventional process, which is not defined in detail herein. The gate conductor layer 112 is deposited through chemical vapor deposition, for example. In addition, from the perspective of solution implementation, other dielectric layers may be arranged between the gate oxide layer and the gate conductor layer, or below the gate oxide layer or above the gate conductor layer, which are all within the protection scope of the present disclosure.

Figure 3B:
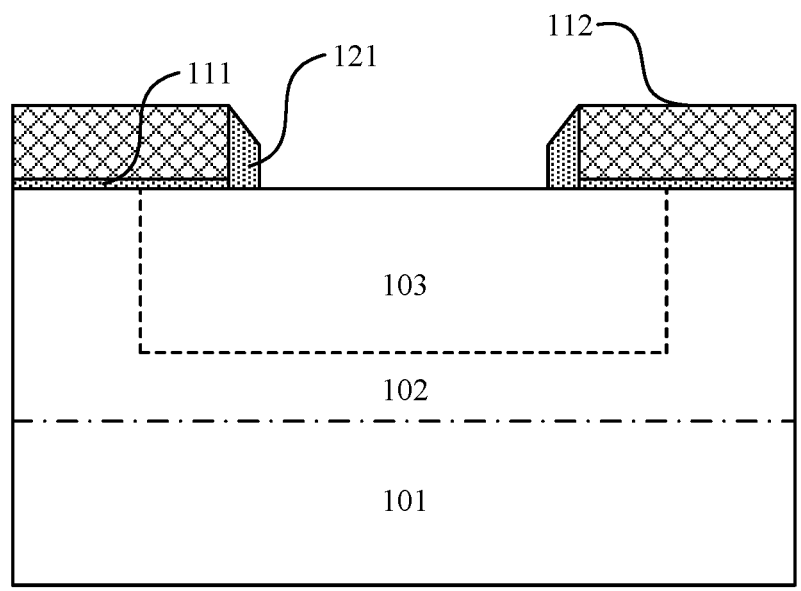
Figure 3C:
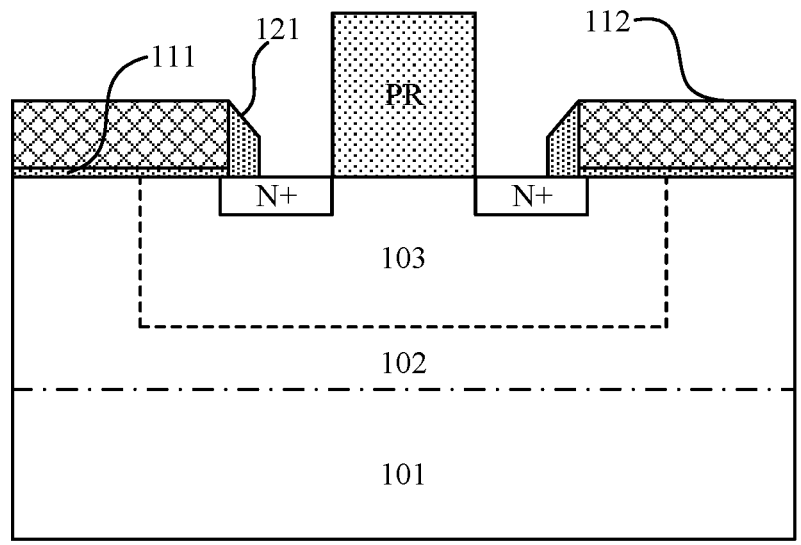

Further, at least one side wall 121 is formed at a side surface of the gate structure. In some embodiments, when forming the side wall 121, a deposition layer (such as a silicon dioxide layer) is formed on a surface of the gate conductor layer 112 and a surface of the first doped region 103, and then etched to form the side wall 121. For example, the side wall 121 is formed by depositing a silicon oxide layer by use of a low pressure tetraethoxysilane pyrolysis (LPTEOS) process and then by use of an etching process. Alternatively, the side wall 121 is formed by forming a silicon oxide layer and then forming a silicon nitride layer, and thereafter by use of an etching process. A section of a formed structure at the source region is shown in FIG. 3b.

Then, ion implantation of a first doping type is performed by using a photoresist process and a mask, to form first lightly doped regions (and the drain region) below the mask and located on both sides of the source region. The first lightly doped region includes a first N+ implantation region and a second N+ implantation region, with a sectional structure shown in FIG. 3c. In some embodiments, after forming the side walls 121, a photoresist layer is deposited on a surface of the gate conductor layer 112 and a surface of the first doped region 103 respectively. The photoresist layer is patterned through photolithography process and mask, and ion implantation of the first doping type can be performed through the patterned photoresist layer. Since the photoresist layer may slip on the surface of the first doped region 103, and the accuracy of the photolithography process itself is limited, in order to ensure that the first N+ implantation region and the second N+ implantation region can fulfill its functions, a size of the first N+ implantation region and of the second N+ implantation region cannot be formed small. For example, in the NLDMOS with 180 nm process, the width of each implantation region is about 0.4 μm.

Figure 3D:
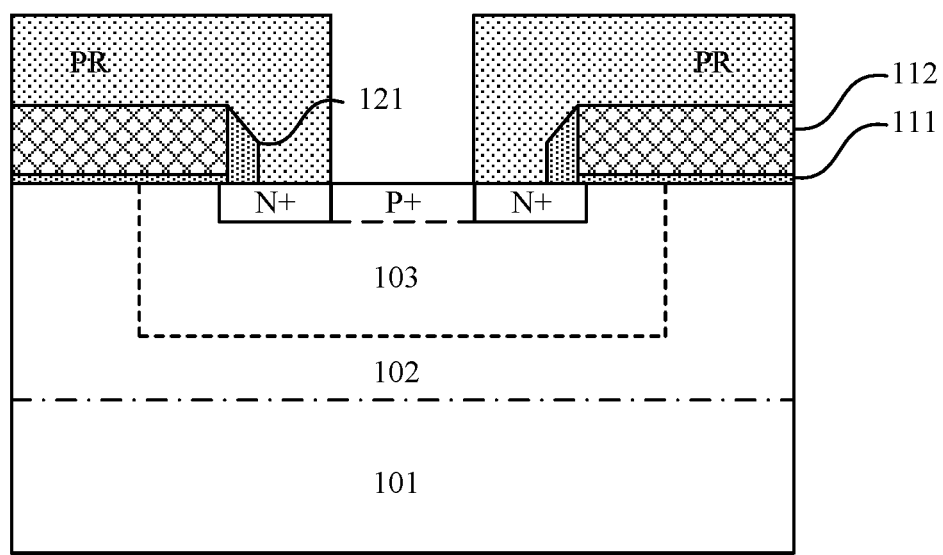

Further, after forming the first N+ implantation region and the second N+ implantation region, the photoresist is removed. Then a photoresist layer is deposited on the surface of the semiconductor structure again, leaving an opening in the middle of the photoresist layer which corresponds to a gap between the two N+ implantation regions, and the width of the opening corresponds to the width of the gap between the two N+ implantation regions. Thereafter, self-aligned ion implantation of a second doping type is performed on a top of the first doped region 103 through the opening of the photoresist layer by use of photoresist process and mask, to form a second lightly doped region in middle between the first lightly doped regions. The second lightly doped region is a P+ implantation region (for example, serve as a body contact region), and a section of a formed structure at the source region is shown in FIG. 3d. The several ion implantations or diffusions are performed with different doping types. For example, ions implanted in the source region for the first time and in the drain region are N-type doping, which include but not limited to phosphorus ions or arsenic ions; ions implanted in the source region for the second time are P-type doping, which include but not limited to boron ions. Due to the same reason as the above, a width of the P+ implantation region cannot be small (for example, in the above NLDMOS with 180 nm process, the width of the P+ implantation region is about 0.4 μm), and the total width of the implantation region within the first doped region 103 is about 1.2 μm, so that a width of the first doped region 103 cannot be optimized to a relative low value, otherwise the performance of the device cannot be realized.

Figure 3E:
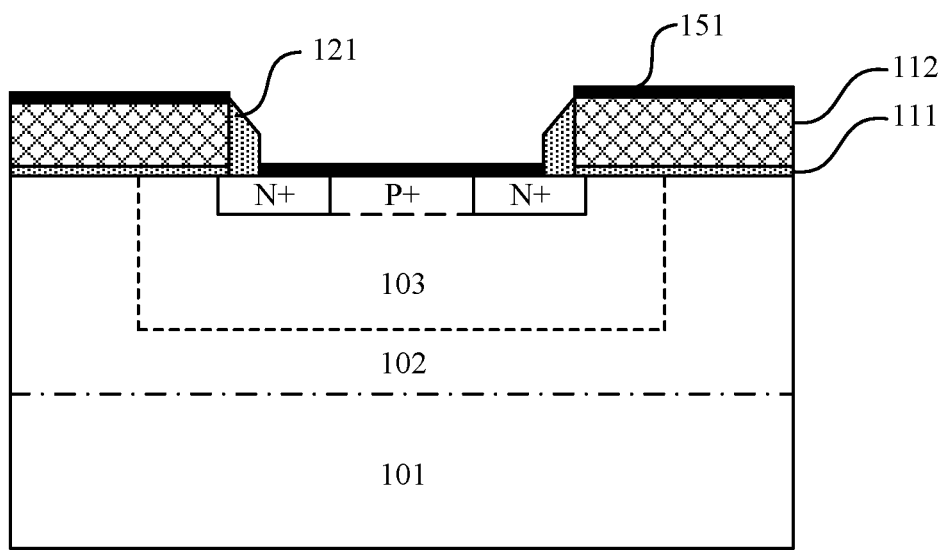
Figure 3F:
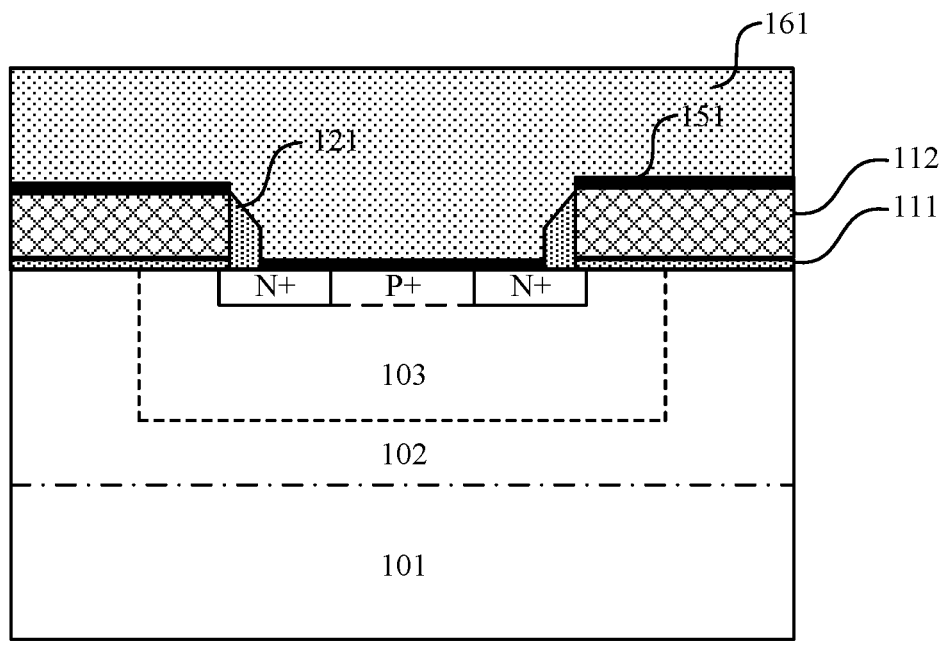

Further, the photoresist layer is removed to form a dielectric layer 151 on the surface of the gate conductor layer 112 and the surface of the first doped region 103. The dielectric layer 151 for example is silicide, which is generally a titanium silicide (TiSi2) film. The silicide is formed as shown in FIG. 3e: a polysilicon layer is deposited on the surface of the source region after removing the mask, then a metal layer (generally titanium (Ti), cobalt (Co) or nickel (Ni)) is deposited on a surface of the polysilicon layer and a surface of the gate structure by sputtering, and then a rapid thermal annealing (RTA) is performed to react the surface of polysilicon with the deposited metal, so that the silicide is formed. Thereafter a dielectric layer 161 is deposited, and is used to provide isolation and protection, and a section of a formed structure at the source region after the deposition is shown in FIG. 3f.

Figure 3G:
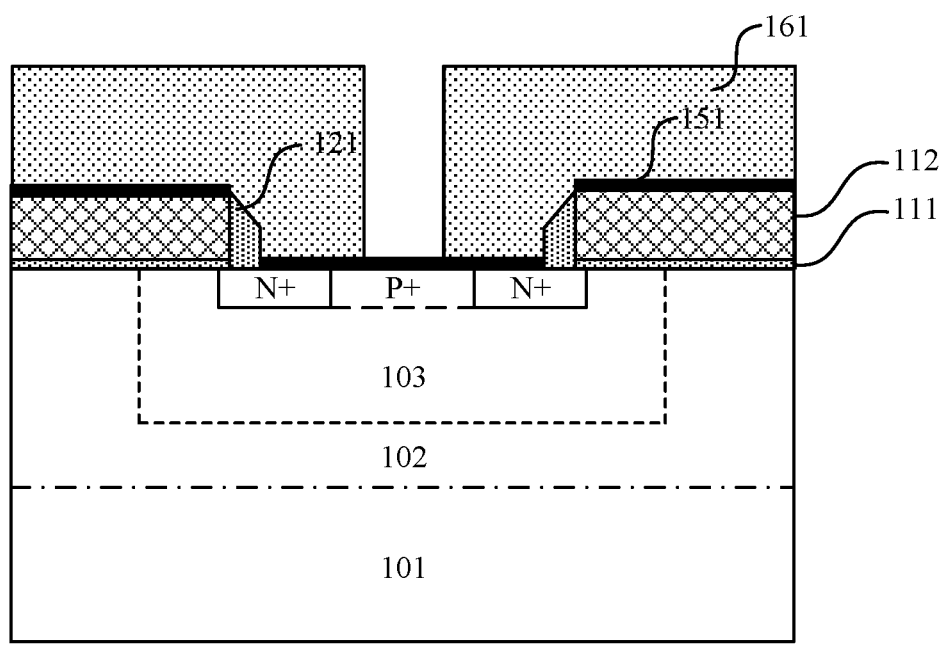

Finally, a through hole 162 arriving a surface of a metal silicide layer and corresponding to the source region is formed by etching, and a section of a formed structure at the source region is shown in FIG. 3g. Then a source electrode is lead out by forming metal contact, so as to complete manufacture of the LDMOS shown in FIG. 1. Generally, in a practical application, due to features of the metal silicide layer, a substrate electrode and the source electrode are connected in common and led out through a same through hole, therefore, in this embodiment, the substrate electrode and the source electrode are collectively referred to as the source electrode, as shown in FIG. 1 and FIG. 3g. The gate oxide layer 111 and the side walls 121 are made from the same material, which may include but not limited to silicon oxide, and the dielectric layer 161 is made from a similar material, which may include but not limited to silicon oxide. The source region has the first N+ implantation region, the P+ implantation region and the second N+ implantation region which are independent from each other and do not contain each other. However, the first N+ implantation region, the P+ implantation region and the second N+ implantation region are interconnected with one another through the metal silicide layer, and are connected to source metal through a metal connection line.

It should be noted that the above description is mainly a schematic representation of a formation process of a source region of the LDMOS device and the sectional structural representation of each stage in the formation process in the prior art, and a structure of the drain region of the device may be understood with reference to common knowledge in the prior art, which is not repeated in the present disclosure.

According to the above introduction, the above first N+ implantation region, the P+ implantation region and the second N+ implantation region located in the source region in the LDMOS are all formed by photolithography implantation. Due to a limit of the photolithography capacity, a sizes of the first N+ implantation region, the P+ implantation region and the second N+ implantation region may not be very small. Taking an NLDMOS (an N-type lateral double-diffused transistor) with a 180 nm process as an example, a first N+ implantation region, a P+ implantation region and a second N+ implantation region in a source region generally has a width of about 0.4 μm respectively. With reference to a structure shown in FIG. 1, the width of a dielectric layer 151 located between the side walls 121 and on the source region is about 1.2 μm. On the basis of this structure, the source-drain on-state resistance of the LDMOS device will be very high, which reduces the performance of the LDMOS device and thusly affects the application prospects of LDMOS device. In addition, the manufacture method of the LDMOS is relatively complicated with more steps which results in difficult operations and high cost.

Based on this, the present disclosure provides the manufacture method of an LDMOS, by improving and optimizing a manufacture process, a first opening of a gate conductor layer above the source region may be reduced, so as to reduce a size of a formed device, and effectively reduce a source-drain on-state resistance.

Figure 4:
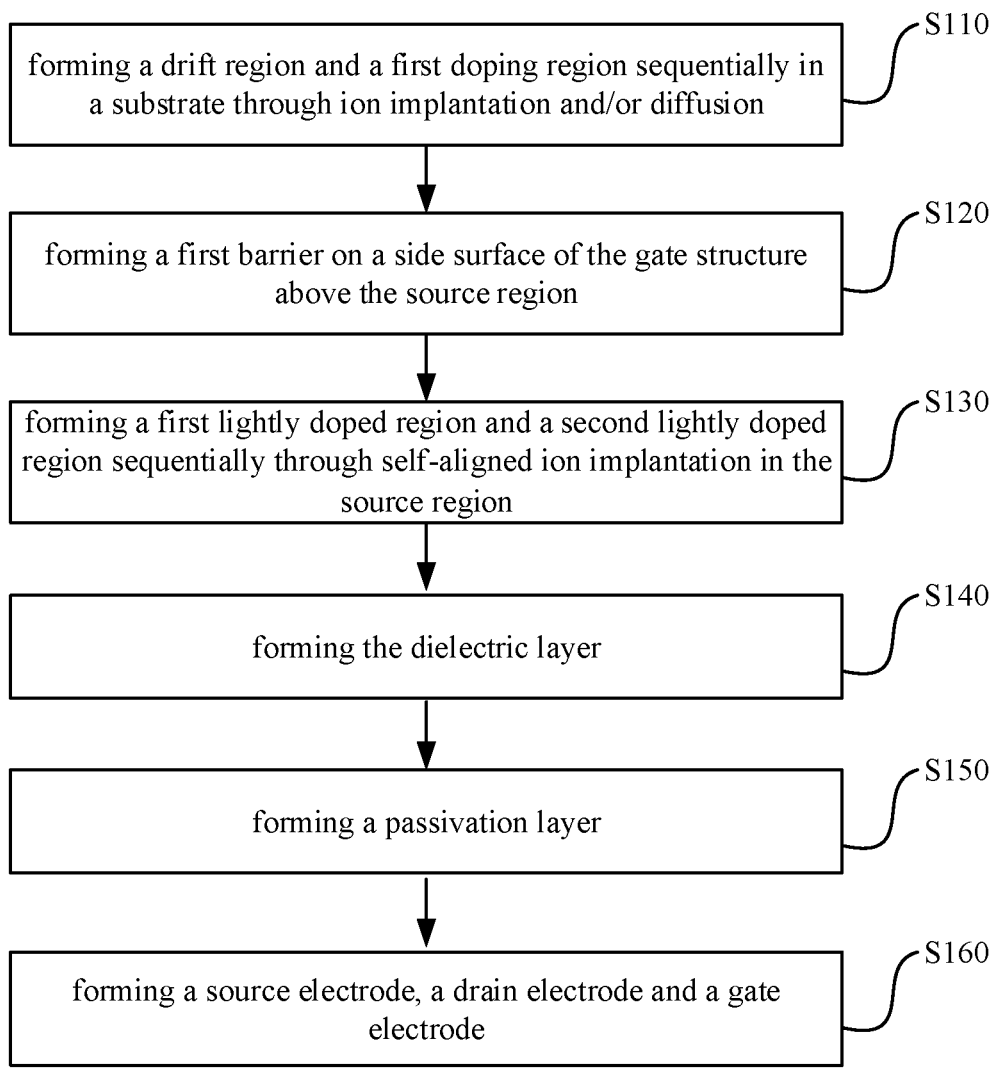
FIG. 4 shows a flowchart of a manufacture method of a LDMOS according to an embodiment of the present disclosure.

FIG. 4 shows a flowchart of a manufacture method of an LDMOS according to an embodiment of the present disclosure. FIGS. 5a-5h show sectional schematic diagrams of formed structures of a source region at various stages in the manufacture method of the LDMOS according to the embodiment shown in FIG. 4 respectively.

Figure 5A:
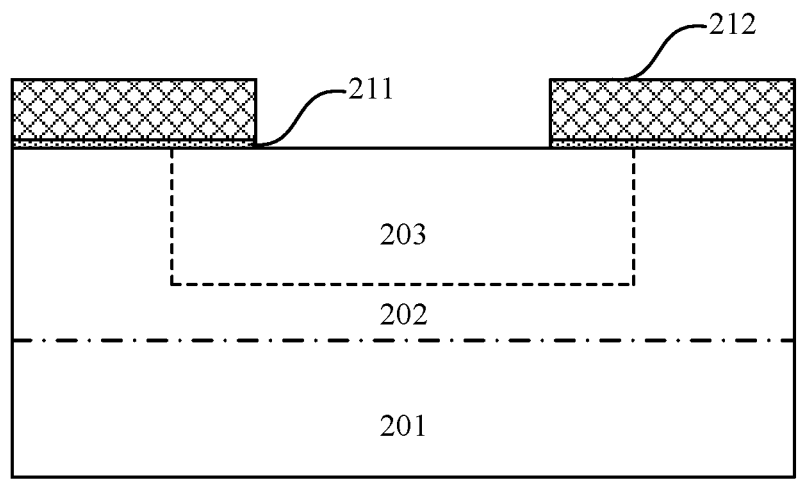
FIGS. 5a-5h show sectional schematic diagrams of formed structures of a source region at various stages in the manufacture method of the LDMOS according to an embodiment shown in FIG. 2 respectively.
Figure 5B:
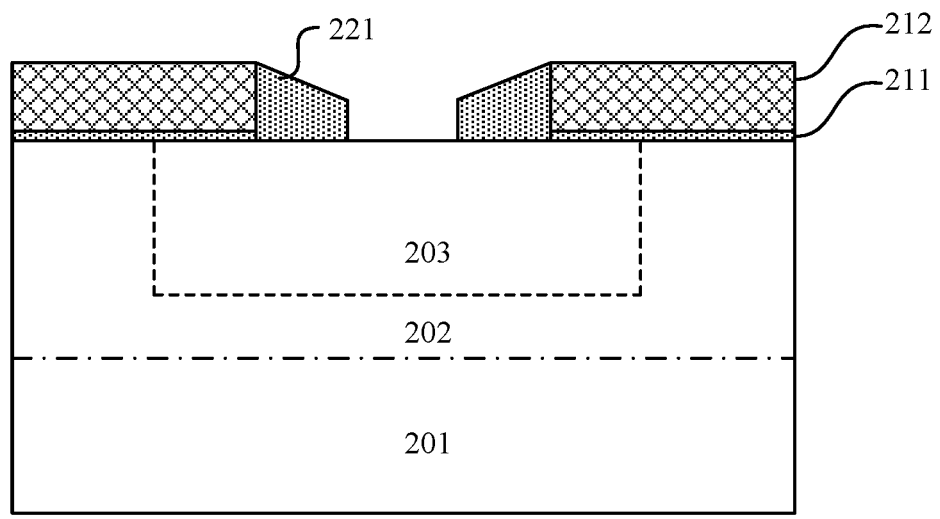
Figure 5C:
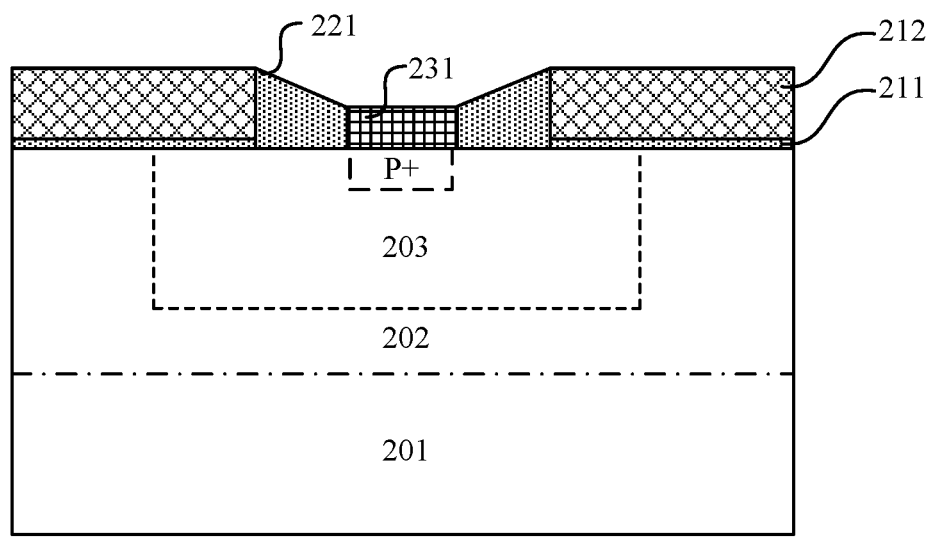
Figure 5D:
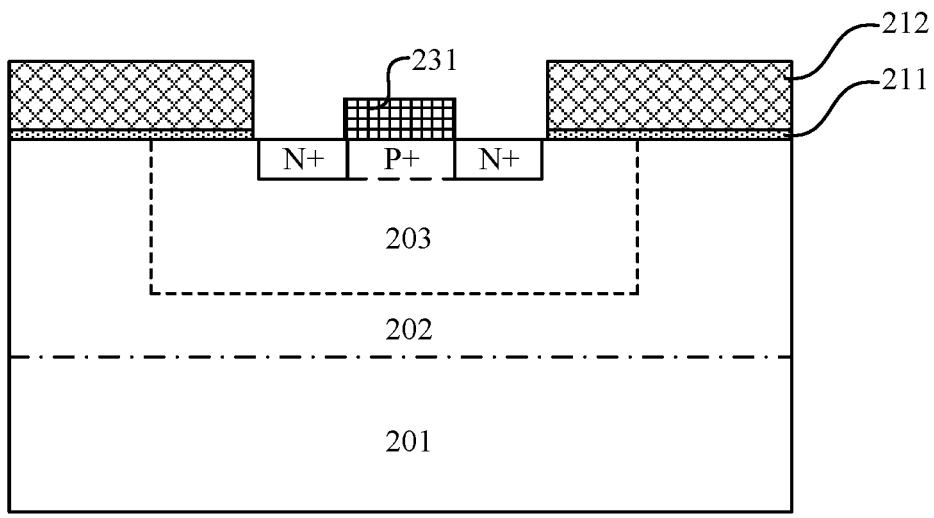
Figure 5E:
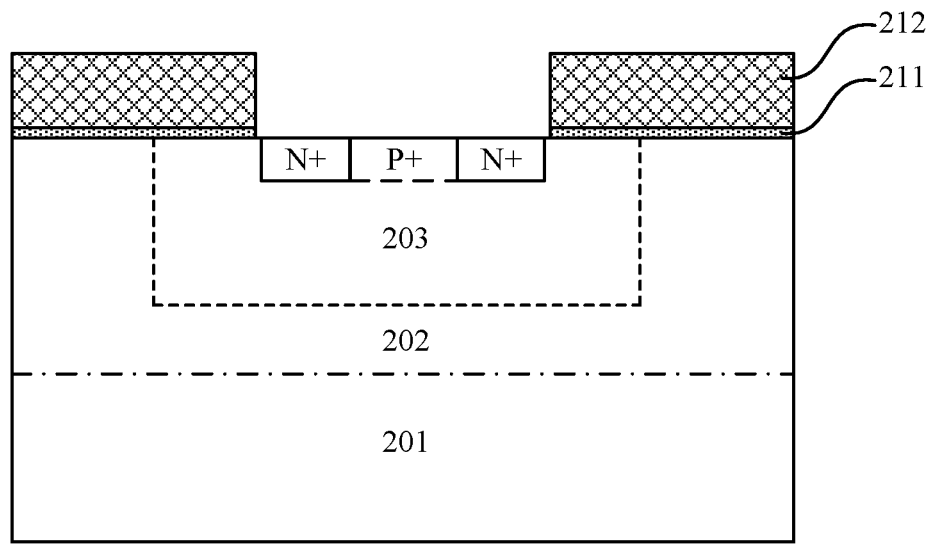
Figure 5F:
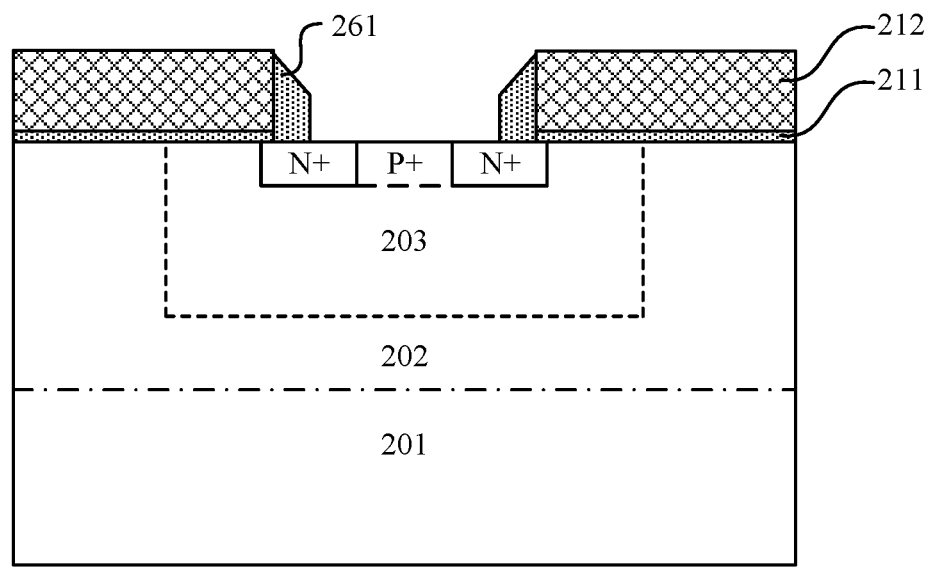
Figure 5G:
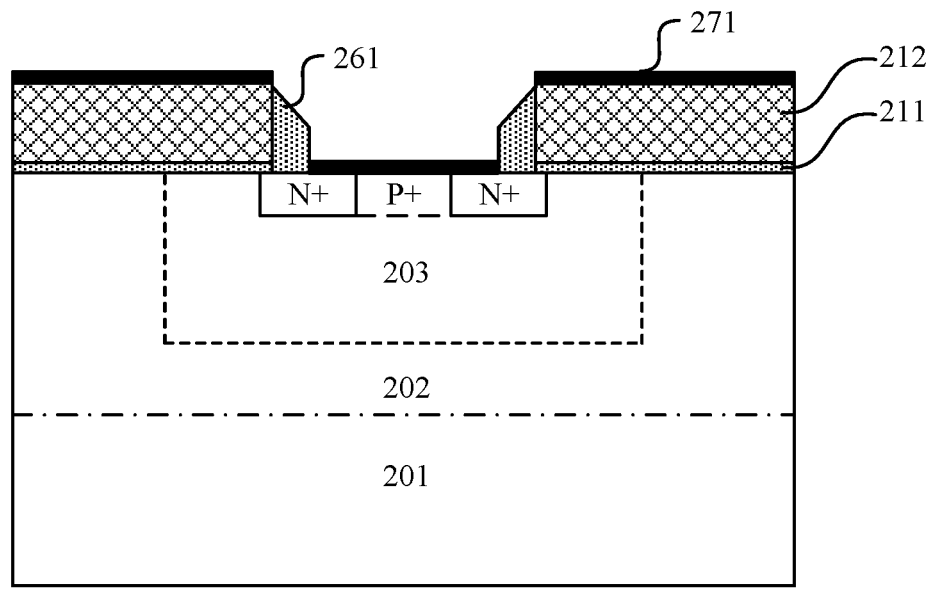
Figure 5H:
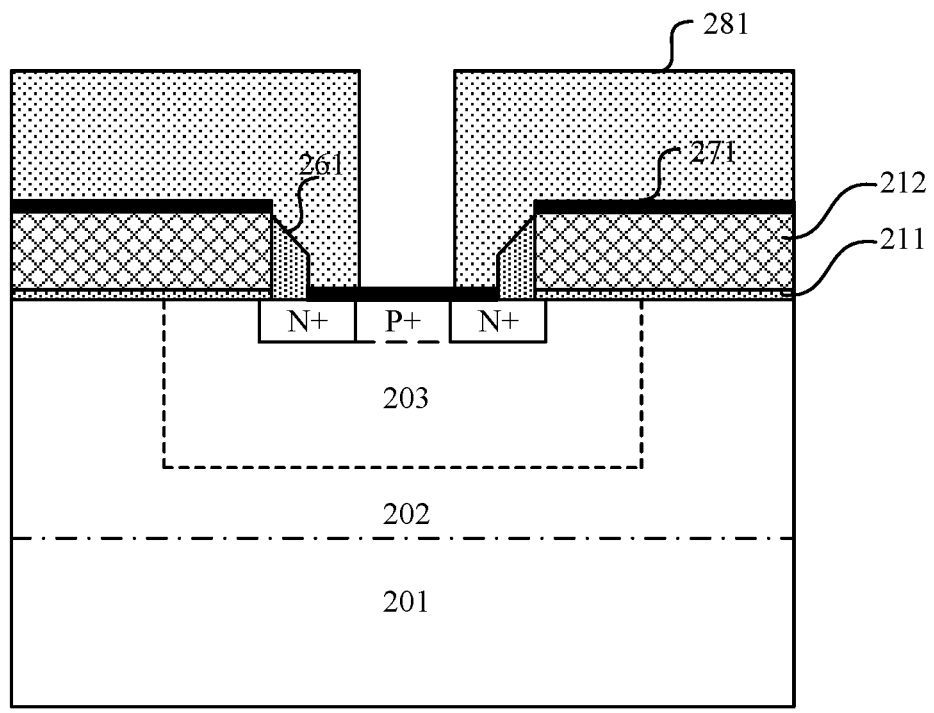

The following describes a manufacture flow of an LDMOS device according to an embodiment of the present application with reference to FIGS. 4-5h.

S110: forming a drift region and a first doped region successively in a substrate through ion implantation and/or diffusion.

In step S110, ion doping and diffusion are performed in an N-type doped semiconductor substrate 201 (such as a silicon substrate), to form a drift region 202 of a first doping type with a certain ion concentration. Then, a gate oxide layer 211 and a gate conductor layer 212 are successively deposited on a surface of the semiconductor substrate 201 to form a mask layer. Then, the gate conductor layer 212 and the gate oxide layer 211 are successively etched by use of an resist layer coated on the gate conductor layer 212 as a barrier, so as to define the source region and a drain region (not shown). A first doped region 203 of a second doping type with a certain ion concentration is formed through ion doping and diffusion, and then the mask layer is removed to form a gate structure with a section structure shown in FIG. 5a. In the sequentially stacked gate structure, the gate oxide layer 211 is for example a silicon oxide layer, and the gate conductor layer 212 is for example a polysilicon layer. In addition, from the perspective of solution implementation, other dielectric layers may be arranged between the gate oxide layer and the gate conductor layer, or below the gate oxide layer or above the gate conductor layer.

Step S120: forming a first barrier layer on a side surface of the gate structure above the source region, the structure includes first side walls of the gate structure and an opening between the first side walls and through the first barrier layer.

According to a traditional process, a side wall is formed by depositing a silicon oxide layer on a surface of the substrate in the source region and closely attached to a side surface of the gate structure by use of an LPTEOS process and then by use of a full etching process. Alternatively, a side wall is formed by forming a silicon oxide layer and then forming a silicon nitride layer, and then by using a full etching process. In step S120, a first side wall 221 is formed in a barrier forming method different from the traditional process, wherein by adjusting isotropic and/or anisotropic etching rates, a width of the formed first side wall 221 (a width of a side wall on a single side herein), for example, may be about 0.2 μm, which is easy to realize in an existing 180 nm process, and its section of a formed structure at the source region is shown in FIG. 5b.

Step S130: forming at least one first lightly doped region and at least one second lightly doped region successively through self-aligned ion implantation in the source region.

In step S130, a first lightly doped region is formed in the source region through self-aligned implantation by use of the gate conductor layer 212 and the first side walls 221. The first lightly doped region has a first doping type and is located between the first side walls 221 on the substrate 201, wherein the first lightly doped region is a P+ implantation region in this embodiment. A second side wall 231 (that is, a second barrier layer formed at the opening of the first barrier layer) is formed between the first side walls 221 on the substrate 201, and by adjusting isotropic and/or anisotropic etching rates, a width of the formed second side wall 231 may be, for example, 0.2 μm. Furthermore, a surface height of the second side wall 231 is approximately equal to an edge height of the first side walls 221 located on both sides thereof, as shown in FIG. 5c.

After the first side wall 221 is removed by dry etching, at least one second lightly doped regions are formed in the source region through self-aligned implantation by use of the gate conductor layer 212 and the second side wall 231. The second lightly doped regions have a second doping type and are located on both sides of the first lightly doped region, wherein the second lightly doped regions are N+ implantation regions in this embodiment, as shown in FIG. 5d. Furthermore, the drain region may be formed through ion implantation in this step. Then, the second side wall 231 is removed by etching, and a section of a formed structure at the source region is shown in FIG. 5e.

It should be understood that the several ion implantations and/or diffusions are performed with different doping types. For example, an ion implantation to form the first doped region 203 and an ion implantation into the source region for the first time are performed by P-type doping, which includes but not limited to boron ions. An ion implantation into the source region for the second time (and implantation into the drain region) are performed by N-type doping, which includes but not limited to phosphorus ions or arsenic ions. In addition, the first side walls 221 may be made from, but not limited to, silicon oxide, and the second side wall 231 may be made from, but not limited to, the silicon oxide or silicon nitride.

Further, the formed second side wall 231 is located at a center of the said source region, and width of each first side wall 221 located on the two sides of the second side wall 231 is approximately equal to the width of the second side wall 231.

Further, a sum of the widths of the formed first side walls 221 and of the formed second side wall 231 approximately equals to the space between the gate conductor layers 212 above the source region.

To sum up, by use of side walls formed through several process steps with combination of the space between the gate conductor layers above the source region, a source region (the source region includes the second implantation region, the first implantation region and the third implantation region which are formed to be sequentially connected) with the implantation regions having different doping types and different doping concentrations is formed through self-aligned implantation of doped ions. Therefore, the implantation regions of the source region are formed in smaller size without limitation of the photolithography process capacity, thusly the space between the gate conductor layers above the source region in the gate structure is effectively reduced. Compared with the prior art (e.g., an N-type LDMOS device with 180 nm process), the space between the gate conductor layers 212 above the source region may overall be reduced to about 0.6 μm, thusly a size of the formed device may be greatly shortened, and the source-drain on-state resistance is effectively reduced.

Step S140: forming a dielectric layer.

In step S140, after the second side wall 231 is removed, at least one third side wall 261 is formed on the side surfaces of the gate structure. A process of forming the third side wall 261 may be identical to the forming process of the first side wall described in this embodiment, or may be same as a traditional side wall forming process, which is not repeated any more herein. A width of the formed third side wall 261 (a width of a single side wall herein) is, for example, about 0.1 μm, then at least one dielectric layers 271 is formed on a surface of the substrate 201 between the third side walls 261 and on a surface of the gate structure on outer sides of the third side walls 261. The dielectric layer 271 is metal silicide, which is generally a titanium silicide (TiSi2) film. The dielectric layer is formed as follows: a polysilicon layer is firstly deposited on the surface of substrate 201 in the source region, then a metal layer (generally titanium (Ti), cobalt (Co) or nickel (Ni)) is deposited on a surface of the polysilicon layer and of the gate structure (the gate conductor layer 212) by sputtering, and then rapid thermal annealing (RTA) is performed, thus the surface of polysilicon is reacted with the deposited metal to form the metal silicide. A section of a formed structure at the source region is shown in FIG. 5g.

Step S150: forming a passivation layer.

In step S150, a passivation layer 281 is deposited on a surface of the dielectric layer 271, is used to provide isolation protection, and may be made from, but is not limited to, silicon nitride. At least one through hole arriving the surface of the dielectric layer 271 (the metal silicide layer) corresponding to the source region, the drain region and the gate structure is formed respectively by use of photolithography and/or etching. A section of a formed structure at the source region is shown in FIG. 5h.

S160: forming a source electrode, a drain electrode and a gate electrode.

In step S160, a source electrode, a drain electrode and a gate electrode are led out by forming metal contacts, so as to complete the manufacture of the LDMOS shown in FIG. 2. Generally, in a practical application, a substrate electrode and the source electrode are connected in common, so in this embodiment, the substrate electrode and the source electrode are collectively referred to as the source electrode.

It should be noted that the above description is mainly a schematic representation of a formation process of a source region of the LDMOS device and the sectional structural representation of each stage in the formation process according to one embodiment of the present disclosure, and a structure of the drain region of the device may be understood with reference to the above embodiment described herein, which is not repeated in the present disclosure.

Further, the above embodiments of the present disclosure are described with the N-type LDMOS device and its manufacture method as examples, but the present disclosure is not limited to it, and is also applicable to the manufacture of a P-type LDMOS device. In addition, the present disclosure takes the 180 nm process as an example, but is also applicable to other process node technology, which is not limited herein.

To sum up, according to the manufacture method of the LDMOS device provided in the embodiment of the present disclosure, in the process of forming the source region in the source region of the LDMOS device, by use of side walls formed through several process steps with combination of the space between the polysilicon layers above the source region, a source region is formed through self-aligned implantation of doped ions, has the first N+ implantation region, the P+ implantation region and the second N+ implantation region, which are successively connected but independent from one another and do not contain each other, without any limitation of the photolithography process capacity. Therefore, the sizes of the formed implantation regions are reduced, that is, the space between the polysilicon layers above the source region in the gate structure is effectively reduced, a size of the formed device may be greatly shortened, and the source-drain on-state resistance is effectively reduced.

In addition, some or all of the steps in the manufacture method of LDMOS device provided in the above embodiments may also be applied to a manufacture process of an LDMOS device with a first doped region formed through a shield gate trench (SGT) process, so as to form leading-out of a source electrode with a very small size, reducing a space of a polysilicon layer above a source region in a gate structure, also shortening a size of the formed device and reducing the source-drain on-state resistance.

Figure 6:
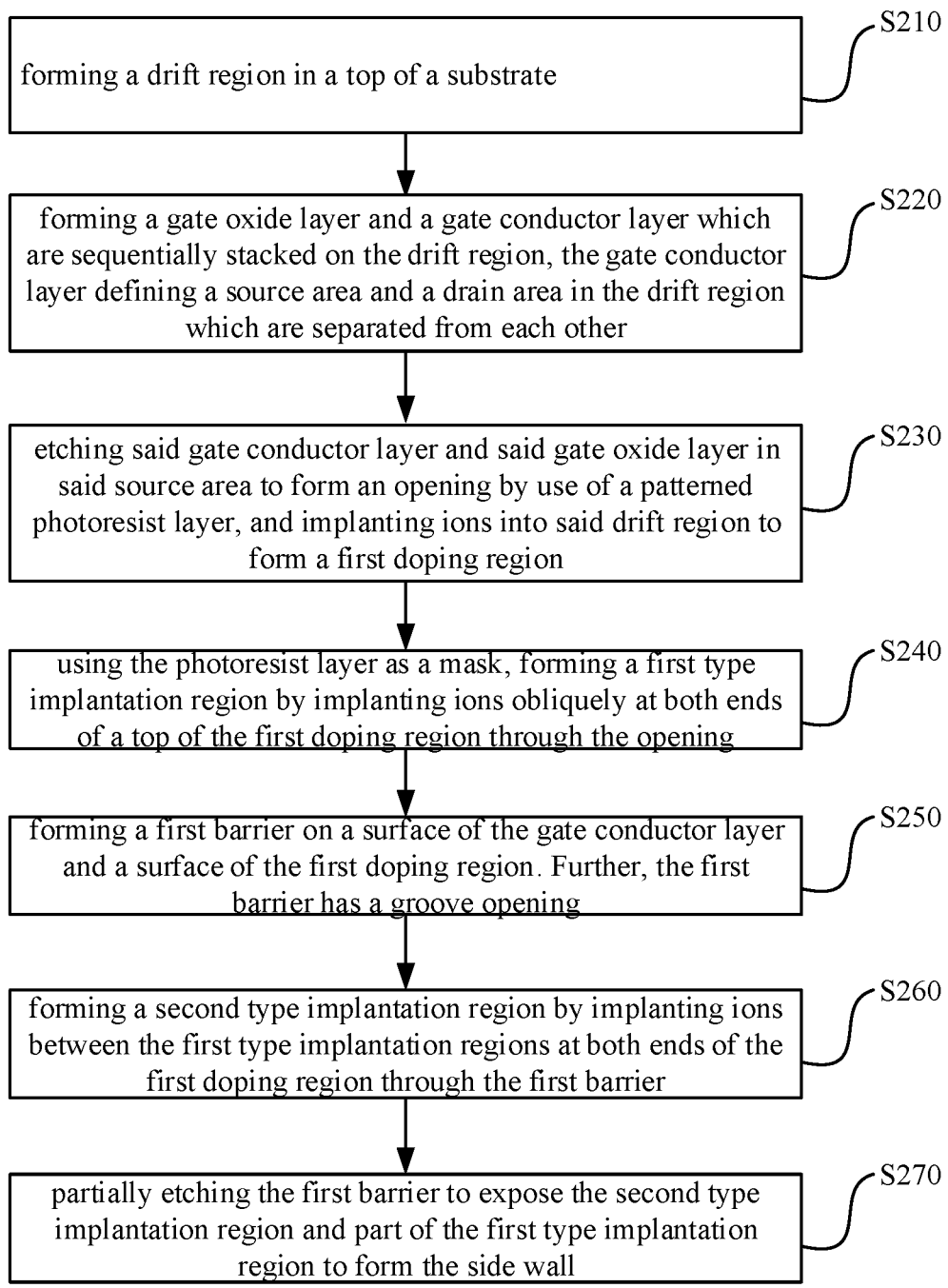
FIG. 6 shows a flowchart of a manufacture method of a LDMOS according to an embodiment of the present disclosure.

FIG. 6 shows a flowchart of a manufacture method of an LDMOS according to an embodiment of the present disclosure; FIGS. 7a-7h show sectional schematic diagrams of the source regions at various stages in a method for manufacturing an LDMOS according to an embodiment of the present disclosure shown in FIG. 6 respectively.

Figure 7A:
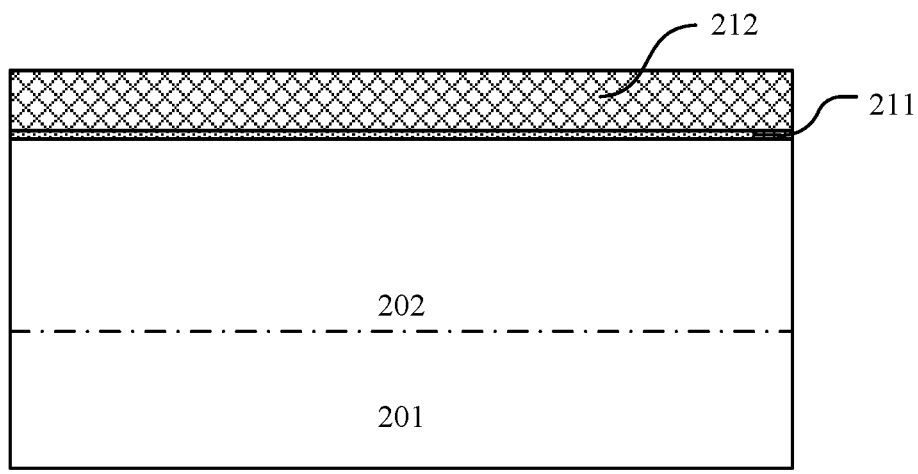
FIGS. 7a-7h show sectional schematic diagrams of formed structures of a source region at various stages in the manufacture method of the LDMOS according to an embodiment of the present disclosure.
Figure 7B:
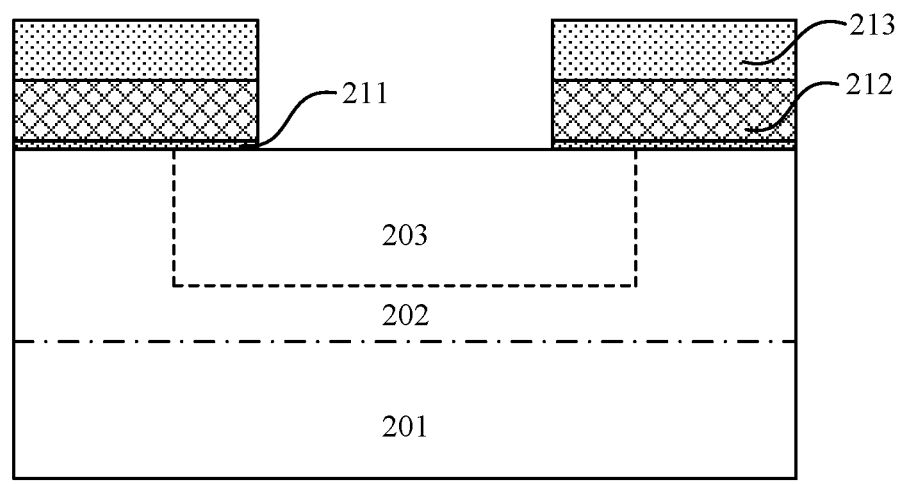
Figure 7C:
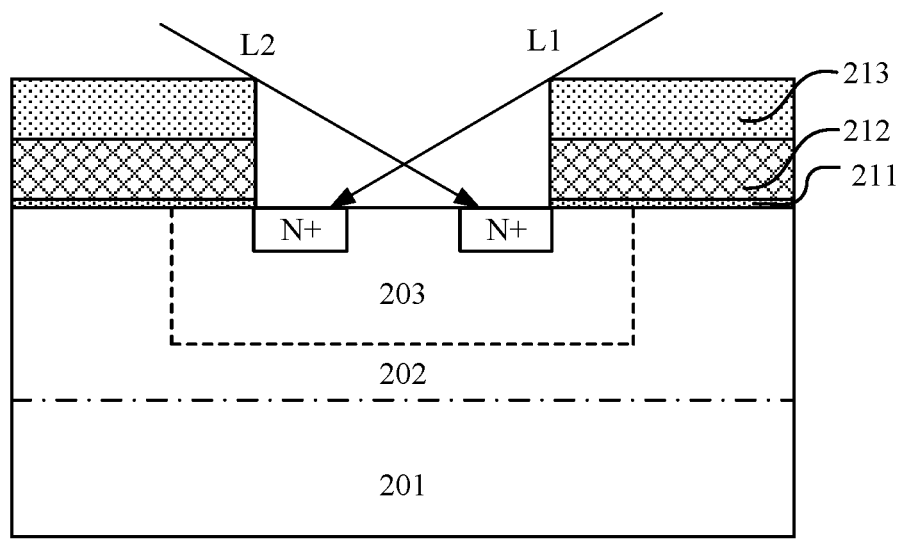
Figure 7D:
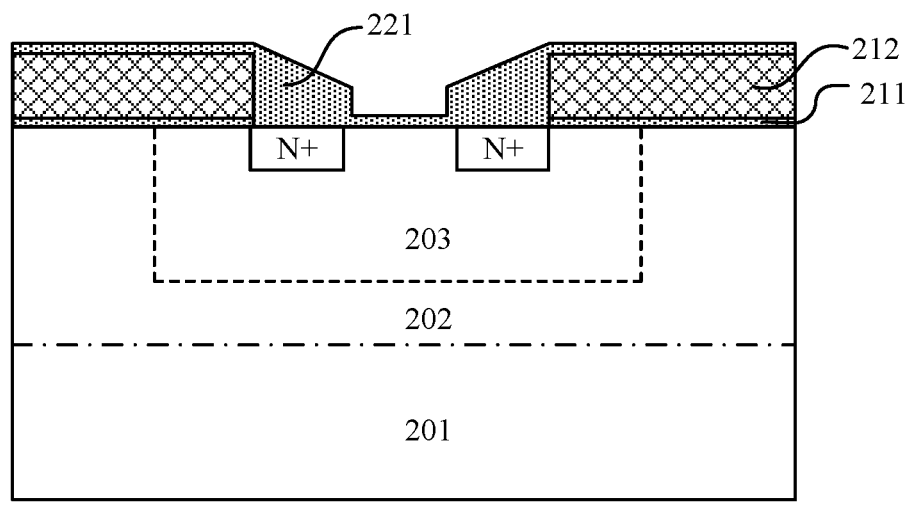
Figure 7E:
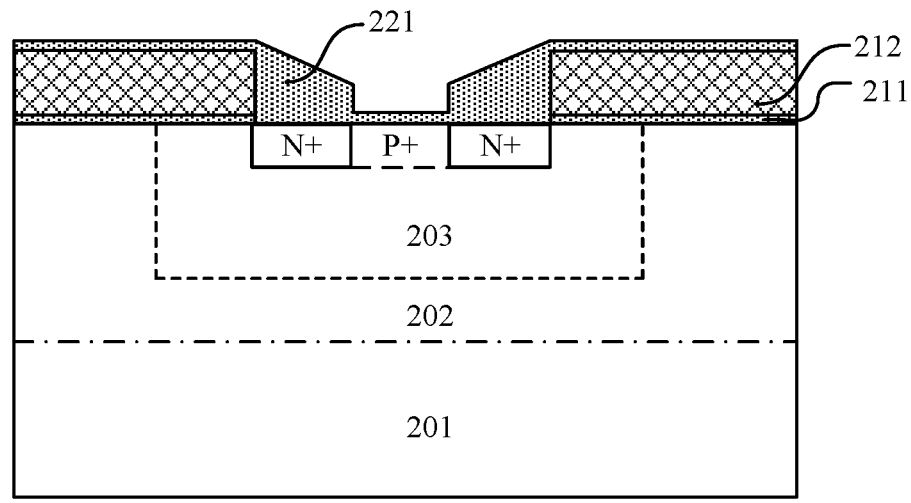
Figure 7F:
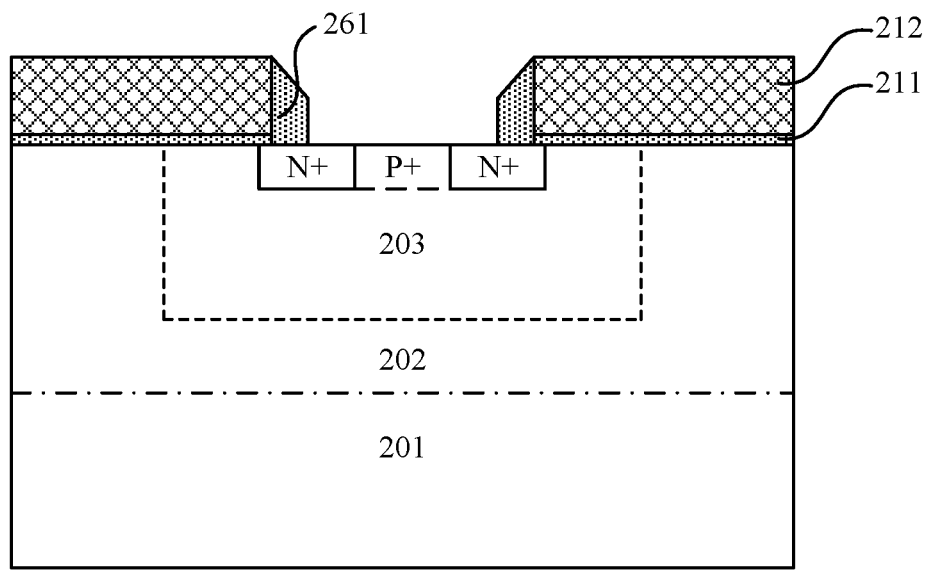
Figure 7G:
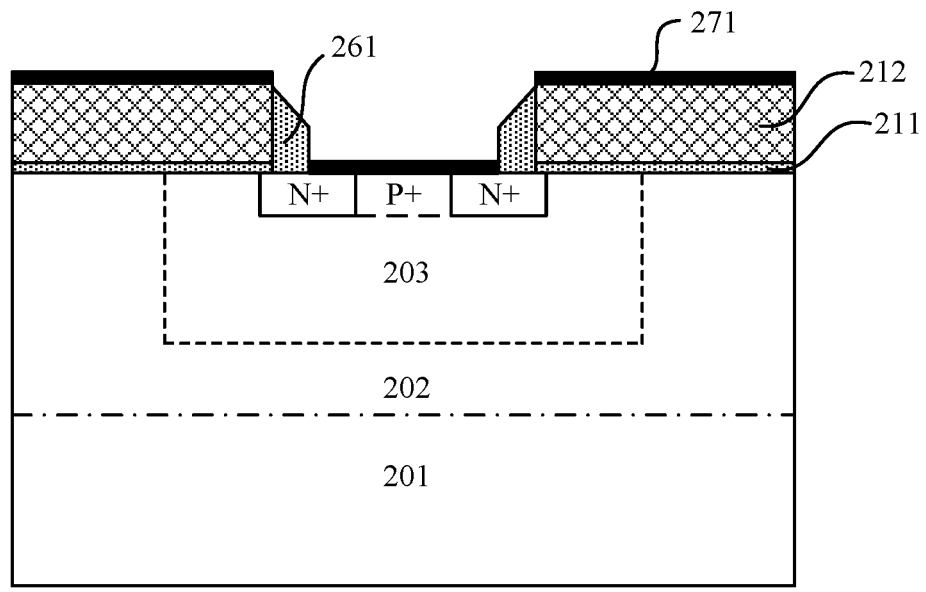
Figure 7H:
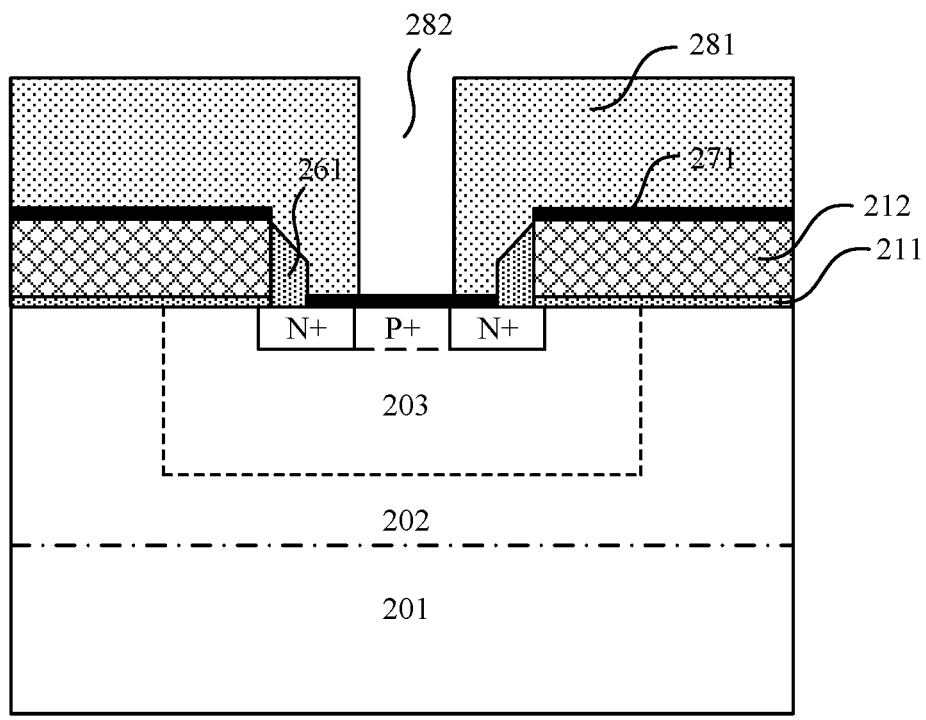

The following describes manufacture flow of an LDMOS device according to an embodiment of the present application with reference to FIG. 6 and FIGS. 7-7h.

In step S210, forming a drift region in a top of a substrate.

As shown in FIG. 7a, a drift region 202 of the first doping type with a certain ion concentration is formed by performing ion doping and diffusion in an N-type doped semiconductor substrate 201 (such as a silicon substrate). The formation of the drift region 202 is a conventional step, and is not repeated herein.

In step S220, forming a gate oxide layer and a gate conductor layer which are successively stacked on a surface of the drift region, wherein the gate conductor layer defines a source region and a drain region which are separated from each other.

As shown in FIG. 7b, a gate oxide layer 211 and a gate conductor layer 212 are successively deposited on a surface of the drift region 202 in the semiconductor substrate 201 to form a gate structure. The gate conductor layer 212 and the gate oxide layer 211 define a source region and a drain region that are separated from each other. FIG. 4b only shows a structure of the source region. The gate oxide layer 211 is, for example, an silicon oxide layer, and the gate conductor layer 212 is, for example, a polysilicon layer. In addition, the formation process of the gate oxide layer 211 and the gate conductor layer 212 is a conventional process, which is not limited in detail herein. The gate conductor layer 212 is formed by, for example, a chemical vapor deposition method. In addition, from the perspective of solution implementation, other dielectric layers may be arranged between the gate oxide layer 211 and the gate conductor layer 212, or below the gate oxide layer 211 or above the gate conductor layer 212.

In step S230, etching the gate conductor layer and the gate oxide layer in the source region to form an opening (that is, a second opening) by use of a patterned photoresist layer, and implanting ions into the drift region through the opening to form a first doped region (for example serving as a body region).

Still referring to FIG. 7b, a photoresist layer 213 used as a barrier is arranged on a surface of the gate conductor layer 212, and the gate conductor layer 212 and the gate oxide layer 211 are successively etched by use of the patterned photoresist layer 213 to form an opening, which is provided for the implantation of a first doped region 203. By means of ion doping and diffusion through the opening, the first doped region 203 of the second doping type with a certain ion concentration is formed in the drift region 202, and then the photoresist layer is removed. Taking an LDMOS with 180 nm node process as an example, a width of the opening is about 0.6 μm, and the width of the opening is defined by the photoresist layer 213. The reason for arranging such width of the opening is that the width is sufficient to realize the implantation of the source region in the subsequent process.

In step S240, forming a first-type implantation region by implanting ions obliquely at both ends of a top of the first doped region through the opening by using the photoresist layer as a mask.

As shown in FIG. 7c, the photoresist layer 213 used in the step S230 is preserved. Using the photoresist layer 213 as a mask at the opening, first-type ions are implanted from left side and right side to the both top ends of the first doped region respectively by means of an oblique large-angle implantation process first-type. The first-type implantation regions are formed by implanting ions along the directions indicated by arrows L1 and L2 shown in the FIG. 7c. The first-type implantation regions includes a first N+ implantation region and a second N+ implantation region, wherein the N+ implantation region is the N+ source region. In this step, a left N+ implantation region is formed by ion implanting along the direction of the arrow L1 from the right to the left, and a right N+ implantation region is formed by ion implanting along the direction of the arrow L2 from the left to the right. By means of this process, a width of the N+ source region (N+ implantation region) may be reduced to about 0.2 μm. In addition, a width of the first-type implantation region in the first doped region 203 is defined according to a thickness of the photoresist layer 213. By means of adjusting the thickness of the photoresist layer 213, a proper width of the N+ implantation region may be obtained. When a certain thickness of the photoresist layer 213 is used as a mask, by use of an oblique implantation process, the dopant ions in the N+ implantation region can only diffuse in a certain determinate region pointed by the arrow, thereby ensuring a certain width of the N+ implantation region. After the implantation is completed, the photoresist layer 213 is removed.

Further, during the oblique ion implantation, the angle between an implanting direction and a normal to a surface of the substrate may be 20-60°, so that the width of the N+ implantation region is ensured.

In step S250, forming a first barrier layer on a surface of the gate conductor layer and a surface of the first doped region. Further, the first barrier layer has a groove opening.

As shown in FIG. 7d, a first barrier layer 221 is formed on the surface of the gate conductor layer 212 and the surface of the first doped region 203. Specifically, a deposition layer is deposited on the surface of the semiconductor structure, and then an etching process is used to form the first barrier layer. For example, the first barrier layer 221 is formed by depositing a silicon oxide layer by use of a chemical vapor deposition process and then of an etching process. Or the first barrier layer 221 is formed by forming a silicon oxide layer at first, then forming a silicon nitride layer, and then by use of an etching process. The sectional schematic of formed structure in the source region is shown in FIG. 7d. For example, dry etching is used to etch the deposition layer to form the first barrier layer 221. The first barrier layer 221 is in a groove shape on the surface of the first doped region 203. The opening above the first doped region 203 has a funnel shape, and a diameter of the "funnel" is relatively wide. A portion of the first barrier layer 221 on two sidewalls of the gate conductor layer 212 above the first doped region 203 is relatively thick, and another portion of the first barrier layer 221 between the two sidewalls on the surface of the first doped region 203 is relatively thin, which is not sufficient to prevent the subsequent implantation. That is, the thickness of the first barrier layer 221 formed on the two sidewalls of the gate conductor layer 212 on both sides of the opening, is greater than the thickness of the first barrier layer 221 formed at a groove between the two sidewalls. However, the relative thin deposition layer formed on the surface of the gate conductor layer 212 and the surface of the first doped region 203 can protect the semiconductor structure. Through this first etching of the deposition layer, the first barrier layer 221 is formed. Further, a width of a groove bottom of the first barrier layer having the groove opening is approximately the same as a width of a gap between the two N+ implantation regions, so as to define a width of a second-type implantation region that needs to be implanted subsequently.

In step S260, forming a second-type implantation region by implanting ions between the first-type implantation regions at both ends of the first doped region through the first barrier layer.

As shown in FIG. 7e, the second-type ion implantation is performed by use of self-alignment technology through the first barrier layer 221 at a position below the groove opening of the first barrier layer 221, to form a second-type implantation region located between the first-type implantation regions, wherein the second-type implantation region is a P+ implantation region, namely a P+ body contact region. A width of the groove of the first barrier layer 221 above the first doped region 203 is approximately equal to the distance between the first-type implantation regions, and the second-type implantation region is adjacent to two first-type implantation regions located at both ends of the first doped region 203 respectively. The first-type implantation region has a first doping type, and the second-type implantation region has a second doping type. The material of the first barrier layer 221 may be, but is not limited to, silicon dioxide or silicon nitride. The thin first barrier layer 221 remaining on the surface of the semiconductor structure in the previous step not only protects and isolates the structure, but also not affects the ion implantation of the implantation region.

In step S270, partially etching the first barrier layer to expose the second-type implantation region and a portion of the first-type implantation region to form at least one side wall.

As shown in FIG. 7f, the first barrier layer 221 is etched again by using a dry etching process to remove the barrier on the surface of the first doped region 203 and the surface of the gate conductor layer 212, so that the second-type implantation region and a portion of the first-type implantation region are exposed, and the remaining barrier that was not etched forms at least one side wall 261. By adjusting the isotropic and/or anisotropic etching rates, the first barrier layer 221 on the surface of the gate conductor layer 212 and the surface of the second-type implantation region is completely etched, and first barrier layer 221 on the two sidewalls of the gate conductor layer 212 at both sides of the opening is partially etched to form the side wall 261.

Since the thickness of the first barrier layer 221 on the sidewalls at both sides of the opening is relatively high, and during the etching process, anisotropic etching and isotropic etching both are used, the formed barrier only retains a certain thickness on the sidewalls at both sides of the opening. By adjusting the isotropic and anisotropic etching rates, a width of the formed side wall 261 is, for example, about 0.2 μm, which is not difficult to implement in an existing 180 nm process.

Further, the side wall 261 is formed in the opening, and may be two independent side walls on the two sidewalls of the gate conductor layer 212 located at both sides of the opening. A height of the surface of the side wall 261 is approximately the same as a height of an edge of the gate conductor layer 212 on both sides thereof. In addition, the thickness of the first barrier layer 221 formed on the two sidewalls is greater than a thickness of the side wall 261 formed on the two sidewalls.

This step is the second etching of the deposition layer. The first etching forms the first barrier layer 221, and the second etching forms the side wall 261, that is, the first barrier layer is etched step by step to form the side wall 261, thereby saving materials of the deposition layer and saving cost. In traditional solution, after the implantation of the second-type implantation region, the first barrier layer needs to be removed and then deposited and etched again to form the side wall, which wastes materials. In this embodiment, when the deposition layer is etched for the first time to form the first barrier layer, it is not completely etched and one layer remains, which protects the semiconductor structure without affecting the implantation. In second etching, the etching may be performed on basis of the original first barrier layer without re-deposition, thusly process steps are simplified.

Compared with the traditional manufacture method, the manufacture method according to this embodiment of the present disclosure simplifies the process for formation of the N+ implantation region and formation of the side wall, which makes process steps more simple and easy to operate, greatly saves costs, and reduces operational complexity. The manufactured LDMOS structure is more reliable, and a size of the device can be optimized, the size of the device is shortend, and the on-state resistance is reduced.

In summary, by use of a photoresist layer as a mask and by means of an oblique implantation to form the N+ implantation region, the width of the N+ implantation region is reduced, the process complexity becomes lower, and a number of masks and photoresist layers to be used are reduced. In addition, the deposition layer is etched twice to form the first barrier layer and the side wall respectively, which can protect the semiconductor structure and save materials. Therefore, the process steps are simplified, so that the source region can not be affected by the limitation of photolithography process capability, thus the formed implantation region is smaller, a space of the openings above the first doped region is effectively reduced, which again simplifies the process steps, and saves materials and costs. Taking a 180 nm process N-type LDMOS device as a reference, a total width of the implantation regions in this embodiment can be reduced to about 0.6 um, which greatly reduces the size of the device and reduces the source-drain on-state resistance.

The process of FIG. 7g and FIG. 7h is similar to a manufacture method of an LDMOS according to a traditional process.

Further, the manufacture method of an LDMOS according to this embodiment further includes: forming a metal silicide layer between the side walls 261 and on an exposed surface of the gate conductor layer 212.

As shown in FIG. 7g, a metal silicide layer 271 is formed, wherein the metal silicide layer 271 is generally a TiSi2 (titanium silicide) film. The metal silicide layer is formed normally as follows: depositing polysilicon layer on a surface of the source region after removing a mask, depositing a metal layer (usually Ti, Co or Ni) on a surface of the polysilicon layer and of the gate structure by sputtering, and then performing rapid heating and flame treatment (RTA) to make the surface of the polysilicon layer and the deposited metal layer react with each other, thusly a metal silicide is formed, which can isolate and protect the semiconductor structure, and prevent it from reacting with other deposition layers.

The manufacture method further includes: forming a dielectric layer on surfaces of the metal silicide layer and the surface of the side wall. At least one through hole is formed in the dielectric layer above a region corresponding to the second-type implantation region, and is connected to the metal silicide layer.

As shown in FIG. 7h, a dielectric layer 281 is deposited, and the dielectric layer 281 is provide for isolation. The sectional schematic of the deposited structure in the source region is shown in the figure. The dielectric layer 281 is deposited on surfaces of the metal silicide layer 271 and the surface of the side wall 261. The dielectric layer 281 is used to provide isolation protection, and material of the dielectric layer may be but not limited to silicon nitride.

Thereafter, at least one through hole arriving the surface of the metal silicide layer 271 (metal silicide layer) corresponding to the source region, drain region, and gate structure is formed through etching by use of hole photolithography mask. The sectional schematic of the structure in the source region is as shown in figures. For example, through etching the dielectric layer 281, a through hole 282 that arrives the surface of the metal silicide layer and corresponds to the second-type implantation region is formed, and then the source electrode is led out through the through hole 282 to form a metal contact. A diameter of the through hole 282 is approximately equal to a width of the second-type implantation region, in other aspect, an area of the through hole is approximately equal to a surface area of the second-type implantation region. The dielectric layer 281 is etched by use of a hole photolithography mask, and due to the existence of the metal silicide layer 271, the N+ source region and the P+ body contact region are interconnected, and they are led out through the through hole 282, thusly the layout of metal lines is simplified.

The manufacture method further includes: forming metal contacts in the drain region, the surface of the gate conductor layer and the through hole to lead out a drain electrode, a gate electrode and a source electrode, respectively.

The source electrode, the drain electrode and the gate electrode are respectively led out by forming metal contacts. Thus, the manufacture of the LDMOS according to this embodiment of the present disclosure is completed. Generally, in practical applications, a substrate electrode and the source electrode are connected in common, so in this embodiment, the substrate electrode and the source electrode are collectively referred to as the source electrode.

The first doping type is P-type, the second doping type is N-type, or the first doping type is N-type, and the second doping type is P-type. N-type doping ions include but not limited to phosphorus ions or arsenic ions, and P-type doping ions include but not limited to boron ions.

According to the manufacture method of this embodiment, based on the formed LDMOS, the size of the implantation region in the source region is reduced, so that the total size of the device is reduced. Therefore, the on-state resistance is reduced, and performance of the device is improved, at the meantime, the manufacture method is simple, easy to operate and realize.

It should be noted that the above description is mainly referring to the formation process of the source region of the LDMOS device and the sectional schematic structure diagram at each stage of the formation process according to one embodiment of the present disclosure. For structure of the drain region of the device, the it may understood with reference to the above embodiment described herein, and is not repeated in the present disclosure herein.

Furthermore, in the above-mentioned embodiments of the present disclosure, the N-type LDMOS device and the manufacture method thereof are described, but the present disclosure is not limited to this, and it is also applicable to the manufacture of P-type LDMOS devices. In addition, the 180 nm process is taken as an example in the present disclosure, but it is also applicable to other process node technology, which is not limited here.

FIGS. 8a-8f show sectional schematic diagrams of the source region at various stages in a method for manufacturing an LDMOS according to another embodiment of the present disclosure respectively.

Figure 8A:
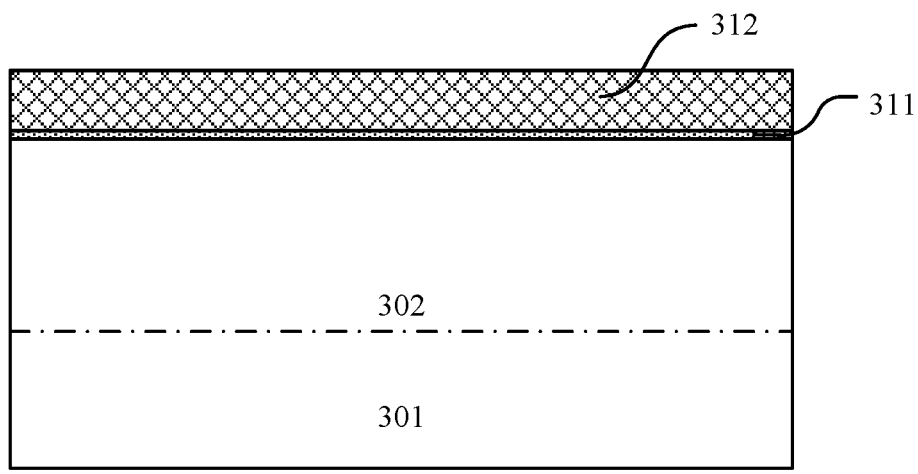
FIGS. 8a-8f show sectional schematic diagrams of formed structures of a source region at various stages in the manufacture method of the LDMOS according to an embodiment of the present disclosure.
Figure 8B:
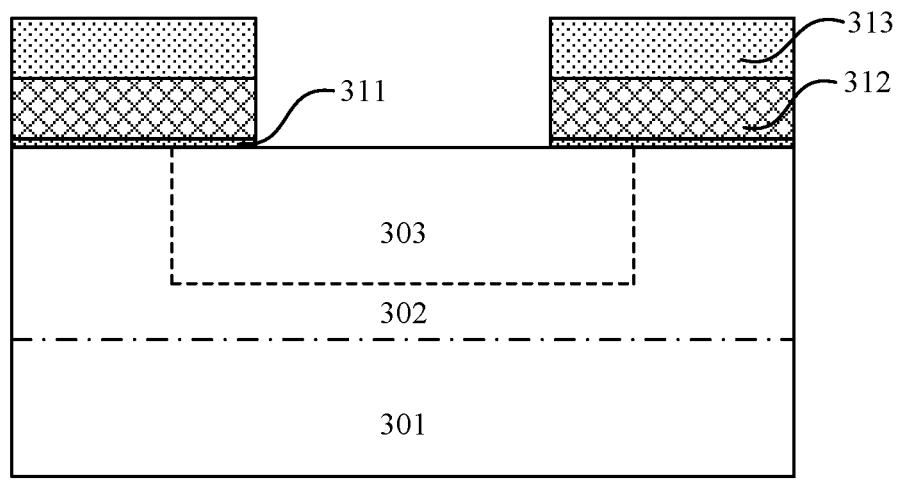
Figure 8C:
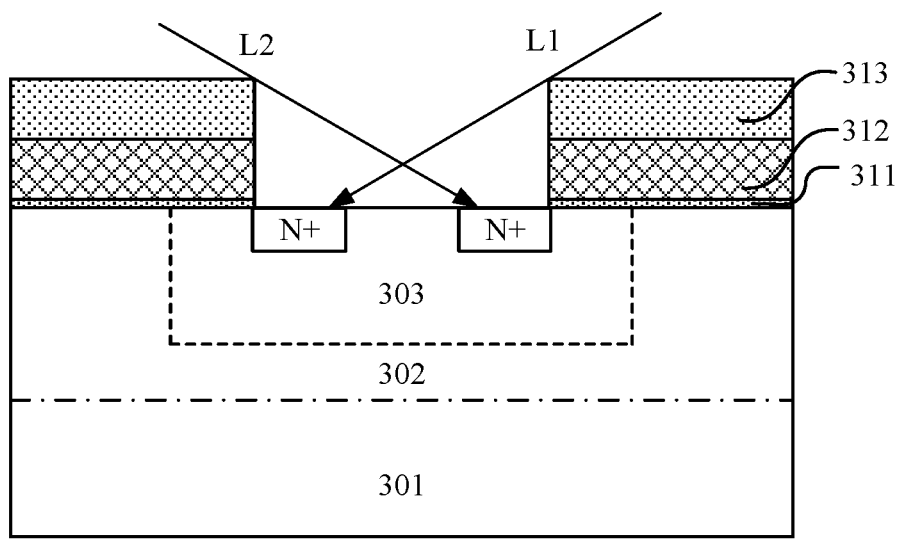

The process steps of FIGS. 8a to 8c are approximately the same as those of FIGS. 7a to 7c, and will not be repeated herein and be understood by those skilled in the art with reference to them.

Figure 8D:
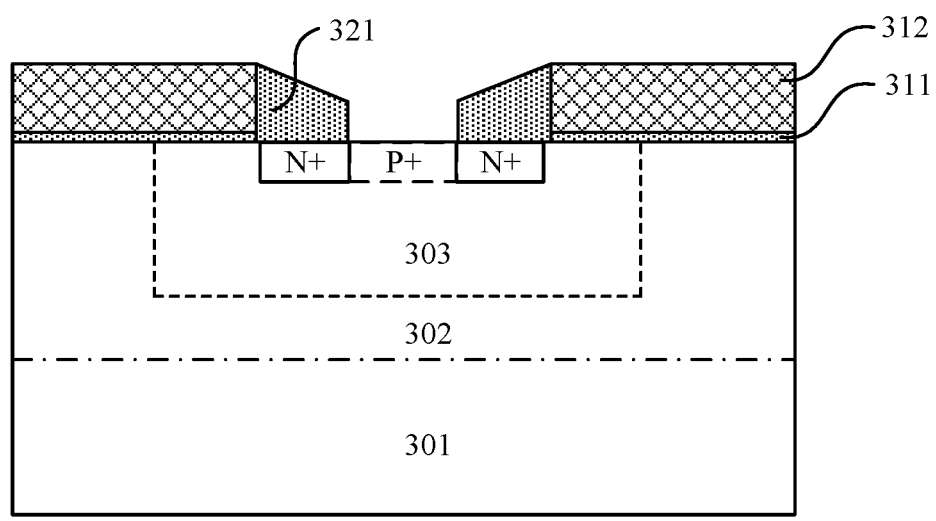

The difference of this embodiment is that in FIG. 8d, a first barrier layer 321 is formed. The first barrier layer 321 is at least one side wall formed at the sidewalls on both sides of the opening above the first doped region 303, and has a relative high thickness. A width of a gap between the side walls on both sides is approximately the implantation width of the second-type implantation region, and then a P+ implantation region is formed through ion implanting in the gap.

Figure 8E:
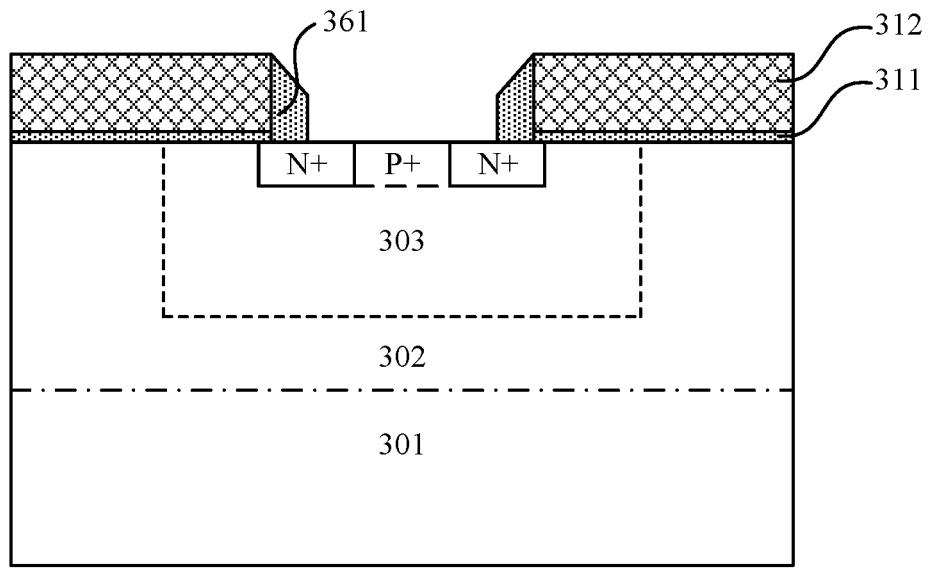
Figure 8F:
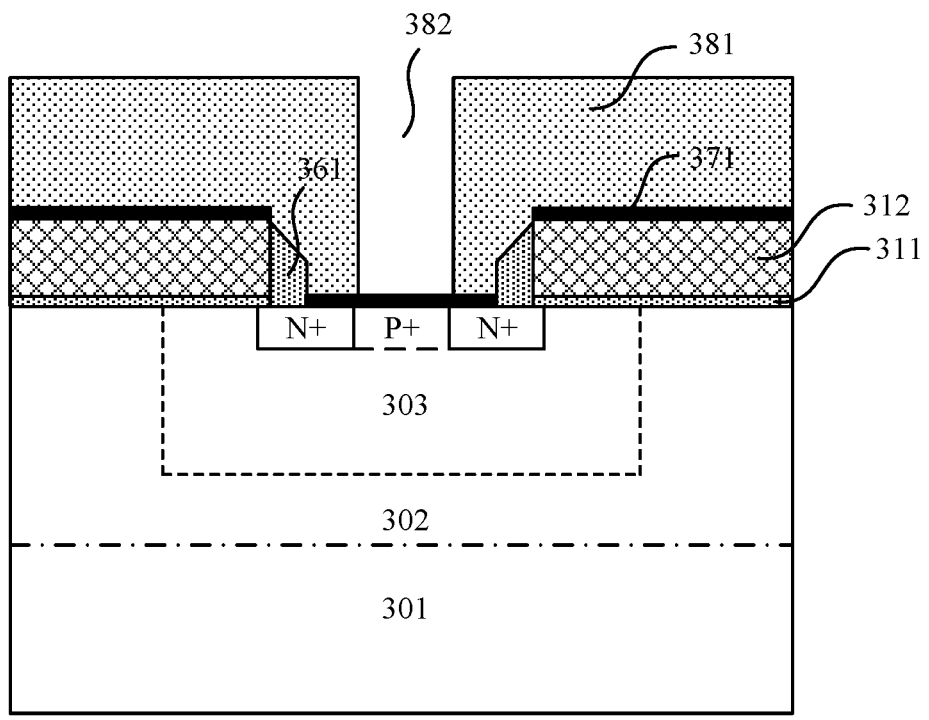

In FIG. 8e, the first barrier layer 321 is removed firstly, then an oxide layer, is deposited, and a side wall 361 is formed by etching. For the process steps from FIG. 8e to FIG. 8f, it may be understood with reference to the process steps of FIG. 7f to FIG. 7h.

The size of the LDMOS structure obtained by the above embodiments is small, the process steps are simple, the on-state resistance is small, and the device performance is improved.

In summary, the manufacture method of the LDMOS provided by an embodiment of the present disclosure includes: forming a drift region with in a substrate; forming a gate oxide layer and a gate conductor layer which are successively stacked on the drift region, the gate conductor layer defining a source region and a drain region in the drift region which are separated from each other; etching the gate conductor layer and the gate oxide layer in the source region to form an opening by use of a patterned photoresist layer, and implanting ions into the drift region to form a first doped region; by use of the photoresist layer, forming a first-type implantation region by implanting ions obliquely at both ends of a top of the first doped region through the opening; forming a first barrier layer on a surface of the gate conductor layer and a surface of the first doped region; forming a second-type implantation region by implanting ions between the first-type implantation regions through the first barrier layer; and partially etching the first barrier layer to expose the second implantation region and part of the first-type implantation region to form a side wall, forming a first-type implantation region by implanting ions obliquely by use of the photoresist layer, controlling the width of the implantation region, and then etching the first barrier layer step by step. Therefore, the size of the implanting region, thereby the size of the device can be reduced and the source-drain on-state resistance can be effectively reduced, and the materials and cost can be saved at the meantime. The entire manufacture method greatly simplifies the process steps and reduces the operation difficulty, so that the on-gate resistance of the device is reduced while simplifying the process.

In addition, some or all of the steps in the manufacture method of LDMOS provided in the above embodiments may also be applied in the manufacturing process of the LDMOS device using the Shield Gate Trench (SGT) process to form a channel region, so that forming a source electrode with a small size, that is, reducing the gap of the polysilicon layers above the source region in the gate structure, reducing the size of the formed device, and reducing the source-drain on-state resistance.

Although the embodiments are separately described and illustrated above, some common technologies are involved, which may be replaced and integrated in opinions of those skilled in the art, and if one of the embodiments is not explicitly recorded, reference may be made to another recorded embodiment for such a content.

It should be noted that in this context, the terms "comprising", "including" or any other variant thereof are intended to cover non-exclusive inclusion, such that a process, a method, an article or a device including a series of elements include those elements, but include other elements not listed clearly, or further include elements inherent to such process, method, article or device. In the case of no more limitations, the element limited by the sentence "comprising a . . . " does not exclude that there exists another same element in the process, method, article or device comprising the element.

Finally, it should be noted that the above embodiments are apparently used for clearly describing examples of the present disclosure rather than limiting to embodiments. A person of ordinary skill in the art may further make other changes or variations in a different form on the basis of the above description. Herein, it is unnecessary or impossible to enumerate all the embodiments. Obvious changes or variations derived based on the same shall still fall within the protection scope of the present disclosure.

What is claimed is:

1. A manufacture method of a lateral double-diffused transistor, comprising: forming a drift region with a second doping type in a substrate with a first doping type; forming a gate structure on the substrate, wherein the gate structure defines a source region and a drain region which are separated from each other in the drift region, and the gate structure comprises a gate oxide layer and a gate conductor layer which are successively stacked on the substrate; forming a first doped region with the first doping type in the source region, wherein the first doped region is surrounded by the drift region; forming a first barrier layer with a first opening on the source region, the first barrier layer is in connect with a sidewall of the gate structure; forming a first implantation region in the source region through self-aligned implantation on the basis of the first opening of the first barrier layer; and forming a second implantation region and a third implantation region in the source region through self-aligned implantation on the basis of the sidewall of the gate structure, the second implantation region and the third implantation region are respectively adjacent to the first implantation region on both sides of the first implantation region.

2. The manufacture method according to claim 1, wherein the step of forming the second implantation region and the third implantation region comprises:

forming a second barrier in the first opening of the first barrier layer, wherein the first opening penetrates the first barrier layer;
removing the first barrier layer by etching.

3. The manufacture method according to claim 1, wherein both sides of the first barrier layer are in contact with two opposite sidewalls of the gate structure respectively.

4. The manufacture method according to claim 1, wherein the step of forming a first barrier layer with a first opening on the source region comprises:
controlling a width of the first barrier layer by adjusting isotropic etching rates and anisotropic etching rates.

5. The manufacture method according to claim 1, wherein the first implantation region has the first doping type, the second implantation region and the third implantation region have the second doping type.

6. The manufacture method according to claim 2, wherein further comprises:
removing the second barrier; and
forming at least one side wall on the sidewalls of the gate structure.

7. The manufacture method according to claim 6, wherein after forming the side wall, the manufacture method further comprises:
forming a dielectric layer on the substrate, wherein the dielectric layer covers a part of the source region exposed by the side wall and an upper surface of the gate structure.

8. The manufacture method according to claim 7, wherein after forming the dielectric layer on the substrate, the manufacture method further comprises:
forming a passivation layer on an upper surface of the dielectric layer, wherein the passivation layer has a through hole above the source region, and the through hole corresponds to a position of the first implantation region and arrives the upper surface of the dielectric layer; and
forming metal contact in the through hole to lead out a source electrode.

9. The manufacture method according to claim 1, wherein the first doping type is P type, and the second doping type is N type;
alternatively, the first doping type is N type, and the second doping type is P type.

10. The manufacture method according to claim 1, wherein the step of forming a gate structure and forming the first doped region comprises:
forming the gate oxide layer and the gate conductor layer which are successively stacked on the drift region;
etching the gate conductor layer and the gate oxide layer through a patterned photoresist layer, to form a second opening exposing the source region; and
implanting ions in the drift region through the second opening to form the first doped region.

11. The manufacture method according to claim 10, wherein the step of forming the second implantation region and the third implantation region comprises:
implanting ions obliquely at the first doped region through the second opening by use of the photoresist layer respectively, to form the second implantation region and the third implantation region,
wherein a width of the second implantation region and the third implantation region are at least defined by an implantation angle and/or a thickness of the photoresist layer.

12. The manufacture method according to claim 10, wherein the step of forming the first implantation region comprises:
after forming the second implantation region and the third implantation region, forming the first barrier layer with a first opening, and forming the first implantation region by implanting ions between the second implantation region and the third implantation region through the first opening of the first barrier layer.

13. The manufacture method according to claim 12, wherein a position of the first opening of the first barrier layer corresponds to a groove opening of the first implantation region, and not penetrates the first barrier layer.

14. The manufacture method according to claim 10, wherein after forming the first implantation region, the second implantation region and the third implantation region, the manufacture method further comprises:

by adjusting isotropic etching rates and anisotropic etching rates, etching a part of the first barrier layer, so that the first barrier layer exposes the first implantation region, a portion of the second implantation region, and a portion of the third implantation region, and remaining first barrier layer serves as at least one side wall of the gate structure.

15. The manufacture method according to claim 11, wherein the implantation angle is the angle between an implanting direction and a normal to a surface of the substrate, wherein the implantation angle is 20-60°.

* * * * *